(12) United States Patent
Nishihara et al.

(10) Patent No.: US 8,554,982 B2
(45) Date of Patent: Oct. 8, 2013

(54) STORAGE DEVICE AND INFORMATION PROCESSING SYSTEM

(75) Inventors: Toshiyuki Nishihara, Kanagawa (JP); Yoshio Sakai, Tokyo (JP)

(73) Assignee: Sony Corporation, Tokyo (JP)

( * ) Notice: Subject to any disclaimer, the term of this patent is extended or adjusted under 35 U.S.C. 154(b) by 1764 days.

(21) Appl. No.: 11/251,867

(22) Filed: Oct. 18, 2005

(65) Prior Publication Data

US 2006/0087893 A1    Apr. 27, 2006

(30) Foreign Application Priority Data

| Oct. 27, 2004 | (JP) | 2004-312500 |
| Oct. 27, 2004 | (JP) | 2004-312501 |
| Jan. 26, 2005 | (JP) | 2005-018370 |
| Jun. 10, 2005 | (JP) | 2005-171141 |

(51) Int. Cl.
*G06F 12/00* (2006.01)
*G06F 13/00* (2006.01)

(52) U.S. Cl.
USPC ............... 711/103; 711/2; 711/5; 711/200; 711/209

(58) Field of Classification Search
USPC .................. 711/2, 5, 103, 200, 209
See application file for complete search history.

(56) References Cited

U.S. PATENT DOCUMENTS

| 4,873,664 A | 10/1989 | Eaton, Jr. |
| 5,787,445 A | 7/1998 | Daberko |
| 2002/0051394 A1 | 5/2002 | Tabita et al. |
| 2003/0005249 A1* | 1/2003 | Wilson et al. ............... 711/165 |
| 2004/0139296 A1 | 7/2004 | Litaize et al. |
| 2005/0138296 A1* | 6/2005 | Coulson et al. ............. 711/141 |
| 2007/0250665 A1* | 10/2007 | Shimada ..................... 711/130 |
| 2009/0210623 A1* | 8/2009 | Lewis ........................ 711/118 |

FOREIGN PATENT DOCUMENTS

| JP | 02-012440 A | 1/1990 |
| JP | 07-114499 | 5/1995 |
| JP | 08-171515 | 7/1996 |
| JP | 09-116107 | 5/1997 |
| JP | 11-259361 | 9/1999 |
| JP | 2000-122929 A | 4/2000 |
| JP | 2000-276363 A | 10/2000 |
| JP | 2003-091463 A | 3/2003 |
| JP | 2004-506256 A | 2/2004 |
| JP | 2004-078902 A | 3/2004 |
| JP | 2005-301591 A | 10/2005 |
| WO | WO-02-01365 A2 | 1/2002 |
| WO | WO-03/042837 A1 | 5/2003 |

OTHER PUBLICATIONS

European Search Report Dated Mar. 2, 2006.

(Continued)

*Primary Examiner* — Midys Rojas
(74) *Attorney, Agent, or Firm* — Rader, Fishman & Grauer PLLC

(57) ABSTRACT

A storage device able to make a redundant write operation of unselected data unnecessary and able to optimize an arrangement of pages to a state having a high efficiency for rewriting, wherein the storage device has a first memory unit, a second memory unit having a different access speed from the first memory, and a control circuit, wherein the control circuit has a function of timely moving the stored data in two ways between the first memory unit and the second memory unit having different access speeds in reading or rewriting.

23 Claims, 27 Drawing Sheets

(56) References Cited

OTHER PUBLICATIONS

"A 125mm 1gb NAND Flash Memory with 10MB/s Program Throughout", ISSCC 2002/Session 6, p. 106, Nakamura, et al.
"A 10ns Read and Write Non-Volatile Memory Array Using a Magnetic Tunnel Junction and FET Switch in each Cell", ISSCC 2000/Session 7, p. 128, Roy Scheuerlein, et al.
"OUM—A 180 nm Nonvolatile Memory Cell Element Technology for Stand Alone and Embedded Applications", IEDM 2001, p. 803, S. Lai, et al.
Novell Colossal Magnetoresistive Thin Film Nonvolatile Resistance Random Access Memory (RRAM), IEDM 2002, W.W. Zhuang, et al.
Japanese Office Action issued Apr. 16, 2013 for related Japanese Application No. 2011-141484.

* cited by examiner

STORAGE DEVICE AND INFORMATION PROCESSING SYSTEM

CROSS REFERENCES TO RELATED APPLICATIONS

The present invention contains subject matter related to Japanese Patent Application No. 2004-312500 filed in the Japan Patent Office (JPO) on Oct. 27, 2004, Japanese Patent Application No. 2004-312501 filed in the JPO on Oct. 27, 2004, Japanese Patent Application No. 2005-018370 filed in the JPO on Jan. 26, 2005, and Japanese Patent Application No. 2005-171141 filed in the JPO on Jun. 10, 2005, the entire contents of which being incorporated herein by reference.

BACKGROUND OF THE INVENTION

1. Field of the Invention

The present invention relates to a storage device including a non-volatile memory and an information processing system, more particularly relates to speedup of data transfer in a storage device including a flash memory.

2. Description of the Related Art

In recent years, as a storage medium of a digital still camera or mobile computer device, attention is paid to a flash memory.

A flash memory is a semiconductor memory using tunneling or hot electron acceleration to make electrons pass through a gate insulation film and injecting them into a floating gate or trap layer to make a threshold value of a cell transistor change and thereby make it store data. A memory cell can be configured by just one transistor using a stacked gate structure, an MNOS structure, etc., therefore a cheap and large capacity memory can be realized. As a representative example, a NAND type flash memory can be explained.

FIG. 1 is a diagram of an example of the internal configuration of a NAND type flash memory. The NAND type flash memory of FIG. 1 has a plurality of memory units 1-1 to 1-$n$ connected to bit lines BL1 to BLn arranged in an array (vertically and laterally). For example, the gate of a selection transistor 2 is connected to a selection gate line SL1, and gates of selection transistors 3 are connected to a selection gate line SL2. Further, gates of memory cells N0 to N15 are connected to word lines WL0 to WL15.

The memory cells N0 to N15 have stacked gate structures and store data according to charge accumulation in the floating gates. Namely, when many electrons are accumulated in the floating gates, the threshold values of the transistors rise, therefore the presence of current passing through the memory units 1 (-1 to -n) from the charged bit lines BL1 to BLn is detected by an access circuit 4 including a sense amplifier etc. to determine the data.

Such a NAND type flash memory does not require that a contact region be provided to the bit line for each memory cell, therefore is suitable for a medium of a particularly large capacity and cheap storage device.

In general, the programming speed of a flash memory is very slow. Several hundred microseconds are required per cell. Further, data cannot be overwritten, therefore it is necessary to erase data before the programming. A time of as long as several microseconds is required for this. This problem is treated by processing many memory cells in parallel.

Namely, by simultaneously writing data in a group of memory cells 5 connected to for example the same word line WL0 and forming a page unit and further erasing a cell block 6 configured by the groups of pages sharing the memory unit, a transfer speed of the program is improved.

Specifically, a 1 Gb NAND type flash memory is described in for example *ISSCC* 2002 *Preprints*, p. 106, Session 6.4. The page size is set to 2 kbytes, and the erase block size is set to 128 kB. Namely, by erasing a group of memory cells of 128 k bytes in parallel in one memory array and programming the memory cells there for each 2 k bytes in parallel, a program transfer speed of 10 MB/s is realized.

On the other hand, high speed non-volatile memories other than flash memories have been proposed in recent years. As a representative example thereof, a ferroelectric memory can be explained. The cell structure and operation of the ferroelectric memory now the mainstream were proposed in S. Sheffield et al. in *ISSCC* 2002 *Preprints*, p. 106, Session 6.4.

FIG. 2 is a circuit diagram of an example of the configuration of a ferroelectric memory disclosed in U.S. Pat. No. 4,873,664 etc.

This ferroelectric memory 10 configures a memory cell by one access transistor 11 and one ferroelectric capacitor 12 and stores a binary value, that is, 1 bit, according to a polarization direction of the ferroelectric capacitor 12. Further, in FIG. 2, BL11 and BL12 indicate bit lines, WL11 indicates a word line, PL11 indicates a plate line, 13 indicates a word line decoder and driver (WLDD), 14 indicates a plate line decoder and driver (PLDD), and 15 indicates a sense amplifier.

For example, in the ferroelectric memory 10, when the word line WL11 is selected and a pulse is applied to the plate line PL11, a read signal appears in the bit line BL11 connected to a counter electrode of the ferroelectric capacitor 12 of the memory cell.

Further, there are several variations in the form of the ferroelectric memory. Japanese Unexamined Patent Publication (Kokai) No. 09-116107 proposes another example.

The inversion of the polarization of the ferroelectric memory is realized in several nanoseconds by just applying 2V to 3V between capacitor electrodes. Accordingly, high speed writing at a cell level is possible, and in addition the power consumption is small. Further, the number of rewrites exceeds 1E10 or larger than that of a flash memory by several orders of magnitude.

Further, as high speed non-volatile memories, other than a ferroelectric memory, a magnetic random access memory (MRAM) using a ferroelectric material, an ovonic unified memory (OUM) using a phase change material, a RRAM, etc. have been proposed.

An MRAM is a semiconductor memory storing data according to a difference in spin direction of ferroelectric films and for example is described by R. Scheuerlein et al. in *Digests of Papers of ISSCC* 2000, p. 128. An OUM is a semiconductor memory storing data by phase transition of for example a chalcogenide film and is described by S. Lai et al. in *Digests of Papers of IEDM* 2001, p. 803. An RRAM is a semiconductor memory storing data by resistance hysteresis of a magnetoresistance effect material and is described by W. W. Zhuang et al. in *Digest of Papers of IEDM* 20021, 7.5. All of these non-volatile memories have higher performances than that of a flash memory in the access speed of the cell level and the number of rewrites by several orders of magnitude.

SUMMARY OF THE INVENTION

In recent years, in order to solve the problems of hard disks such as the magnitude of power consumption, the length of the seek time, the shock resistance, portability, etc., their replacement by flash memories is being anticipated. However, as explained above, a flash memory has the defect that an increase of speed cannot be achieved unless the access unit is made large. Further, data cannot be overwritten, therefore erasure is necessary for rewriting, and an erase block at that time is further larger. The erase unit being tens of times larger than the access unit in this way is a general specification in a flash memory having a long erasing time and suffering from disturbances in unselected cells at the time of writing. However, the write efficiency is remarkably degraded due to this.

For example, assume that a storage device for replacing a hard disk is configured by using a flash memory of a transfer speed of 10 MB/s using block erasing in units of 128 kB. When desiring to raise the transfer speed up to the 160 MB/s targeted for high speed storage by a serial ATA connection, it is necessary to employ a multi-bank or multi-chip configuration and make for example 16 memory arrays operate in parallel.

FIG. 3 is a conceptual view of a flash memory configuring such a storage device. In FIG. 3, in order to realize high speed transfer, 16 arrays AR0 to AR15 are simultaneously operated. In this case, at the time of writing data, for example pages P0 to P1 are simultaneously written, while at the time of the erasing data, blocks B0 to B15 are simultaneously erased. At this time, the actual page region 24 forming one write unit reaches 32 kB, and the actual erase block region 21 forming one erase unit reaches 2 MB.

On the other hand, in an ordinary file system, the cluster size forming the minimum write unit is about 4 kB, and random access is carried out in this unit. In that case, a request for rewriting for example only pages P0 and P1 is generated. However, when such access is carried out by the above device, the entire actual erase block region 21 must be erased. If there is a valid file in the unselected region in that, it is necessary to protect it from erasure. A typical example of coping with that is as follows.

1. First, the data of the entire actual erase block region 21 is read out from the flash memory to a memory region 22 of a separately provided buffer memory 23.

2. Next, the data corresponding to the pages P0 and P1 is updated in the memory region 22.

3. Next, the block region 21 in the flash memory is erased.

4. Finally, all of the updated block data of the memory region 22 is written back to the erased region 21 described above.

Namely, for writing 4 k bytes, erasure and the reading and writing of 2 MB of data become necessary in actuality. Accordingly, the actual transfer performance becomes remarkably low. In view of this situation, the present storage device using a flash memory can only obtain a transfer performance much lower than that of a hard disk at the time of writing.

Note that, as the above variation, it is also possible to separately provide a spare erased block region 27 in the flash memory and perform the write back operation of 4 there so as to make the erasing time of 3 seem invisible. However, it is still necessary to read and write 2 MB of unselected data sharing the actual erase region.

On the other hand, ferroelectric memories, MRAMs, OUMs, RRAMs, and other high speed non-volatile memories use unique storage substances and electrode metals, therefore are more expensive than flash memories and are lower in degree of integration due to various restrictions in processing. Accordingly, it is difficult to use them as they are for large capacity storage media in view of costs.

Further, in recent years, mobile phones and other mobile computer devices have been mounting numerous semiconductor memories other than flash memories. Further, particularly in such battery driven devices, reduction of the power consumption in the stand-by mode has become important.

Originally, for such applications, the semiconductor memory is ideally non-volatile, able to perform random access, has a large capacity, and is cheap. However, there is actually no such memory, therefore various types of different memories must be selectively used for each application.

FIG. 4 is a block diagram of an example of the configuration of an information processing system (computer system) selectively using various types of memories for different applications.

In a system 30 of FIG. 4, a CPU 31 is connected to a NOR type flash memory 33 and a DRAM 34 via a system bus 32. Regions of both memories 33 and 34 are mapped in the system memory. The NOR type flash memory 33 stores the boot code, operating system, and applications. Further, the DRAM 34 is loaded with and executes a portion of the application and forms a work area of the operating system.

The system bus 32 is connected to a group of interface circuits 35 for accessing external peripheral devices. The group of interface circuits 35 are connected to a NAND type flash memory module 36 and other peripheral apparatuses 37-1 to 37-3.

Here, the NAND type flash module 36 is configured by one or more flash memories and a control circuit. This control circuit has a function of avoiding access to a defective block, a function of applying encoding error correction by using an ECC circuit, and other functions. The NAND type flash module is matched in specification with an ATA interface etc. used for connecting for example a hard disk and is accessed as a peripheral storage device in units of blocks. It stores images and other user data and a portion of the application.

Among these various types of memories, a NOR type flash memory 33 can perform random reading in units of words and can be treated as a system memory, but is expensive. Further, usually, only access as a ROM is possible. It cannot be treated as a RAM. Exceptional operation different from ordinary access is necessary for rewriting. In addition, a very long time is taken. On the other hand, a DRAM 34 can perform random access, but is volatile, so consumes power just by holding data. Accordingly, even when unused, the battery is used. In the worst case, the required user data is lost.

Contrary to this, a NAND type flash memory module 36 has the cheapest bit unit price and is non-volatile, but cannot perform random access and in addition has restrictions in rewriting. Namely, in the case of a flash memory, as previously explained, erasing is always necessary for rewriting, and the erase block at that time is further larger than the page of the usual access unit. The erase unit being tens of times larger than the access unit in this way is a general specification in a flash memory having a long erasing time and suffering from disturbances in unselected cells at the time of writing. This results in an extreme deterioration of the processing efficiency when rewriting at random in small units.

The above problems will be explained with reference to FIG. 5. FIG. 5 is a diagram conceptually showing a rewrite operation of a NAND type flash memory. In FIG. 5, P0 to P15 indicate pages, B0 to B15 indicate blocks, 41 indicates the actual erase block region, 42 indicates the memory region, 43 indicates the buffer memory, and 44 indicates an actual page region.

For example, when it is desired to for example use a flash memory having a transfer speed of 10 MB/s writing pages in units of 2 kB and erasing blocks in units of 128 kB so as to raise the transfer speed up to the 160 MB/s of a general DRAM, it is necessary to employ a multi-bank or multi-chip configuration and make for example 16 memory arrays operate in parallel. Here, assume that 16 arrays AR0 to AR15 are simultaneously operated.

In this case, for example pages P0 to P15 are simultaneously written at the time of writing data and the blocks B0 to B15 are simultaneously erased at the time of erasing data. At this time, the actual page region 44 forming the one write unit reaches 32 kB, and the actual erase block region 41 forming one erase unit reaches 2 MB.

When random rewriting is requested at such a memory in for example units of pages, the entire actual erase block region 41 must be erased. If there is valid data in an unselected region in that, it is necessary to protect that from erasure. A typical example of how to deal with this becomes as follows.

1. First, the data of the entire actual erase block region 41 is read out from the flash memory to the memory region 42 of the separately provided buffer memory 43.

2. Next, the desired data is updated in the memory region 42.

3. Next, the block region 41 in the flash memory is erased.

4. Finally, all of the updated block data of the memory region 42 is written back to the erased region 41.

Namely, to rewrite very small data, actually the erasure and reading and writing of 2 MB of data become necessary. Specifically, 200 μs is required for reading and writing 1 page's worth of data, and 2 ms is required for erasing a block, therefore approximately 30 ms is required. Accordingly, the actual transfer performance becomes remarkably low. Due to this, present storage devices using flash memories can obtain only a transfer performance much lower than that of a general DRAM particularly at the time of writing.

To deal with such a problem, for example Japanese Unexamined Patent Publication (Kokai) No. 05-216775, Japanese Unexamined Patent Publication (Kokai) No. 06-349286, etc. propose the use of a cache memory. In this case, if the page to be updated is a page stored in the cache, i.e., the cache is "hit", only the page in the cache is updated, therefore a redundant operation as explained above does not immediately occur.

Whatever the case, it is necessary to reflect the updating of the data somewhere in the flash memory. Therefore, the same work as the work in the past is necessary when writing back the data. Namely, as shown in FIG. 5, a buffer memory 43 is provided in the storage device, all of the data of the actual erase block region 41 including the original pages P0 to P15 corresponding to the updated pages is read out to the buffer memory 43, and the actual erase block region 41 is erased. Suitably thereafter, the updated pages from the cache are overwritten on the buffer, then finally all data in the buffer is written back to the original block region 41. If the cache continues to fail to hold the data, i.e., is "missed", in the end it becomes necessary to perform the above operation whenever a page is updated.

As explained above, it is desired to realize a storage device able to make a redundant write operation of unselected data unnecessary and able to optimize the arrangement of pages to a state having a high efficiency for rewriting.

Further, it is desired to realize a semiconductor storage device and an information processing system seemingly able to perform random access, operating at a high speed, and having a large capacity.

According to a first aspect of an embodiment of the present invention, there is provided a storage device comprising a first memory unit, a second memory unit having a different access speed from the first memory, and a control circuit, wherein the control circuit has a function of timely moving the stored data in two ways between the first memory unit and the second memory unit having different access speeds in reading or rewriting.

Preferably, the control circuit moves the data accessed for reading from the outside or the data accessed for rewriting to the memory unit of the higher access speed.

Preferably, the first memory unit includes a semiconductor memory requiring previous erasing for rewriting, a block region serving as an erase unit includes a plurality of page regions serving as access units, the second memory unit includes a semiconductor memory having a faster rewriting speed than the first memory unit, and the control circuit moves the data in the first memory unit accessed for the rewriting from the outside to the second memory unit.

Preferably, the first memory unit includes a non-volatile memory, and the second memory unit includes a non-volatile memory using a ferroelectric material, a phase change material, a ferromagnetic material, or a magnetoresistance effect material for the memory element.

Preferably, the first memory unit includes a hard disk drive, the second memory unit includes a semiconductor memory, and the control circuit moves the data in the first memory unit accessed for reading or rewriting from the outside to the second memory unit.

Preferably, the second memory unit includes a non-volatile memory using a ferroelectric material, phase change material, ferromagnetic material, or magnetoresistance effect material for the memory element.

Preferably, the device is formed with an address conversion table indicating correspondence between page addresses input from the outside and actual locations of the page data in the first or second memory unit using specific data groups as page units, and the control circuit has a function of moving data from the first memory unit to the second memory unit in units of the pages, updating the address table, and invalidating original page regions in the first memory unit and a function of moving data from the second memory unit to the first memory unit in units of pages, updating the address table, and invalidating the original page regions in the second memory unit.

Preferably, the address conversion table is stored in the second memory unit.

According to a second aspect of an embodiment of the present invention, there is provided a storage device comprising a first memory unit, a second memory unit, and a control circuit, wherein the first memory unit includes a non-volatile memory and has a plurality of page regions serving as access units of the data and block regions serving as erase units, each block region includes a plurality of page regions, the second memory unit includes a cache memory of the first memory unit and stores data of a plurality of page regions read out from any erase block in the first memory unit independently from each other, and the control circuit has a function of independently moving page data to an erased page region different from the original page region in the first memory unit in units of pages when writing back the page data stored in the second memory back to the first memory unit.

Preferably, the storage device is formed with an address conversion table indicating the correspondence between page addresses input from the outside and locations of the page data in the second memory unit, and the control circuit updates the address conversion table in accordance with the writing position when writing back data.

Preferably, when data is accessed from the outside, the control circuit refers to the address conversion table in the device and judges whether or not the desired data is stored in the second memory unit serving as a cache.

Preferably, when updating page data stored in the first memory, the control circuit moves the page data into the second memory unit, updates the address conversion table in accordance with the movement position, and invalidates the original region of the page data in the first memory unit.

According to the embodiment of the present invention, for example, in the storage device, the high performance auxiliary memory added to the low performance main memory is not treated as a temporary storage medium of the main memory like a cache memory in the past, but is treated as a medium equivalent to the main memory. More specifically, the storage device of the embodiment of the present invention treats two types of memories having different access characteristics in the same class and flexibly assigns the data between the two in accordance with the characteristics. Accordingly, the data stored on the high performance auxiliary memory side is not a temporarily stored copy of the data of the main memory, but the actual data shifted from the main memory. In such a storage device, it is no longer necessary to constantly reflect the updating of data performed for the auxiliary memory in the main memory. When the auxiliary memory becomes full, it is sufficient to just timely move the stored data to an appropriate erased region of the main memory. It is possible to flexibly select the movement position by considering the efficiency of the system.

According to a third aspect of an embodiment of the present invention, there is provided a storage device comprising a first memory unit, a second memory unit operating at a higher speed and having a smaller capacity than the first memory unit, and an address conversion table, wherein the address conversion table converts a logic address input along with access from the outside to a physical address defining a memory region in the first memory unit or the second memory unit and assigns the access to access to the first or second memory unit, data stored in the second memory unit is managed as an array using the physical addresses as indexes, and data is successively discarded from the previously stored data according to need and moved to the first memory unit.

Preferably, the data array constructed in the second memory unit includes a spare field for each index and stores logic address corresponding to each data.

According to a fourth aspect of an embodiment of the present invention, there is provided a storage device comprising a first memory unit, a second memory unit perating at a higher speed and having a smaller capacity than the first memory unit, and an address conversion table, wherein the address conversion table converts a logic address input along with access from the outside to a physical address defining a memory region in the first memory unit or the second memory unit and assigns the access to access to the first or second memory unit, data stored in the second memory unit is managed by a link list using the physical addresses as indexes, newly stored data is added to one end of the link, and data on an opposite side is discarded according to need and moved to the first memory unit.

Preferably, the management table of the link list includes provided with a spare field for each index and stores the logic address corresponding to each data.

According to a fifth aspect of an embodiment of the present invention, there is provided a storage device comprising a first memory, a second memory serving as a cache memory of the first memory, and a control circuit, wherein the first memory includes a non-volatile memory and has a plurality of page regions serving as access units of the data and block regions serving as erase units, each block region includes a plurality of page regions, and the control circuit has a function of reading the data of a plurality of page regions from different block regions, storing the same in the second memory, and rearranging and writing the stored data in the same block in the first memory.

Preferably, the second memory includes a non-volatile memory able to perform rewriting in units of page regions or units smaller than that.

Preferably, the second memory includes a non-volatile memory using a ferroelectric material, phase change material, ferromagnetic material, or magnetoresistance effect material.

Preferably, the control circuit stores the page data read out from the first memory and updated in the second memory when updating the page data in the first memory and further invalidates the original page region in the first memory.

Preferably, the control circuit stores correspondence information between the logic address for each page configuring at least a portion of the address in the data access and a physical address indicating the location of the page in the first or second memory inside it.

According to the embodiment of the present invention, for example the control circuit reads out the data in a plurality of page regions from the block regions different from each other and stores them in the second memory. Then, the stored data are rearranged and written in the same block in the first memory.

According to a sixth aspect of an embodiment of the present invention, there is provided a storage device comprising a first memory, a second memory operating at a lower access speed than the first memory, an address conversion table including physical addresses with respect to logic addresses, and a control circuit, wherein the control circuit acquires a physical address corresponding to an input logic address by referring to the address conversion table when accessed from an outside, accesses the first memory when the acquired physical address designates the inside of the first memory, and transfers the data in the second memory into the first memory according to need when the physical address designates the inside of the second memory.

Preferably, when the physical address designates the inside of the second memory and there is no copy of the desired data in the first memory, the control circuit transfers at least the related data from the second memory to the first memory.

Preferably, when the access is for reading, the data transfer includes a copy of the data, while when the access is for writing, the data transfer includes movement of the data accompanied with updating of the address conversion table.

Preferably, when the physical address designates the inside of the second memory, there is a copy of the desired data in the first memory, and the access is for writing, the control circuit updates the copy portion, updates the address conversion table, and changes the physical address corresponding to that data so as to designate the copy region.

Preferably, provision is further made of a status notification pin, and when data is transferred, a busy state is notified to the notification pin.

Preferably, the first memory includes a random access memory, and the second memory includes a flash memory.

Preferably, the first memory unit includes a non-volatile semiconductor memory comprising a non-volatile random access memory using a ferroelectric material, a phase change material, a ferromagnetic material, or a magnetoresistance effect material for the memory element.

According to a seventh aspect of an embodiment of the present invention, there is provided a storage device comprising a first memory unit, a second memory unit having a larger memory capacity than the first memory unit, a control circuit, and a notification status pin, wherein the first memory unit includes a non-volatile semiconductor memory comprising a non-volatile random access memory using a ferroelectric material, a phase change material, a ferromagnetic material, or a magnetoresistance effect material for the memory element, the second memory unit includes a flash memory, the control circuit accesses the first memory unit when the desired data or a copy of the data is present in the first memory unit when the memory is accessed from the outside, while transfers the desired data to the first memory unit from the second memory unit when it is not present, and a busy state is notified to the notification pin when data is transferred.

According to an eighth aspect of an embodiment of the present invention, there is provided an information processing system comprising a semiconductor storage device, wherein the semiconductor storage device has a first memory unit, a second memory unit having a larger memory capacity than the first memory unit, a control circuit, and a notification status pin, the first memory unit includes a non-volatile semiconductor memory comprising a non-volatile random access memory using a ferroelectric material, a phase change material, a ferromagnetic material, or a magnetoresistance effect material for the memory element, the second memory unit includes a flash memory, the control circuit accesses the first memory unit when the desired data or a copy of the data is present in the first memory unit when the memory is accessed from the outside, while transfers the desired data from the second memory unit to the first memory unit when it is not present, a busy state is notified to the notification pin when data is transferred, an interruption occurs in the system along with the notification of the busy state, and the system interrupts the memory access and stands by until completion of the transfer.

According to the embodiment of the present invention, for example the storage device is configured as a non-volatile memory appearing to enable random access, operating at a high speed, and having a large capacity by combining a ferroelectric memory or other high speed non-volatile memory (hereinafter referred to as an "NVRAM") and a cheap and large capacity non-volatile memory such as for example a NAND type flash memory. Both memories function as storage devices of the data. When the desired data or a copy of the data is present in the NVRAM, the outside can access the NVRAM in the same way as access with respect to a usual random access memory. On the other hand, when they are not present in the NVRAM, this is notified to the system by the notification pin, and the desired data is transferred from the large capacity flash memory to the NVRAM. The system suspends the memory access and stands by during that time.

Further, in the embodiment of the present invention, it is judged whether or not the desired data is present in the NVRAM by using an address conversion table. This provides the following flexibility to a general cache system using cache tags for judgment. In the usual cache system, only a copy of the data stored in the main memory is stored in the cache. Accordingly, when data in the cache is updated from the outside, it is necessary to write it back to the original position of the main memory without fail. As previously explained, when using the flash memory as the main memory, this restriction causes a large overhead. Contrary to this, in the embodiment of the present system, by updating the address conversion table, the main portion of the data can be moved to the NVRAM side. Accordingly, by replacing for example the copy by the main portion of the data to invalidate the original data, writing back no longer becomes necessary, and the problem of the overhead can be solved. Further, when there is no longer sufficient empty region at the NVRAM side, the data can be freely moved to a preferred empty position in the flash memory.

BRIEF DESCRIPTION OF THE DRAWINGS

These and other objects and features of the present invention will become clearer from the following description of the preferred embodiments given with reference to the attached drawings, wherein.

DESCRIPTION OF THE PREFERRED EMBODIMENTS

Below, an explanation will be given of embodiments of the present invention with reference to the drawings.

First Embodiment

Figure 6:
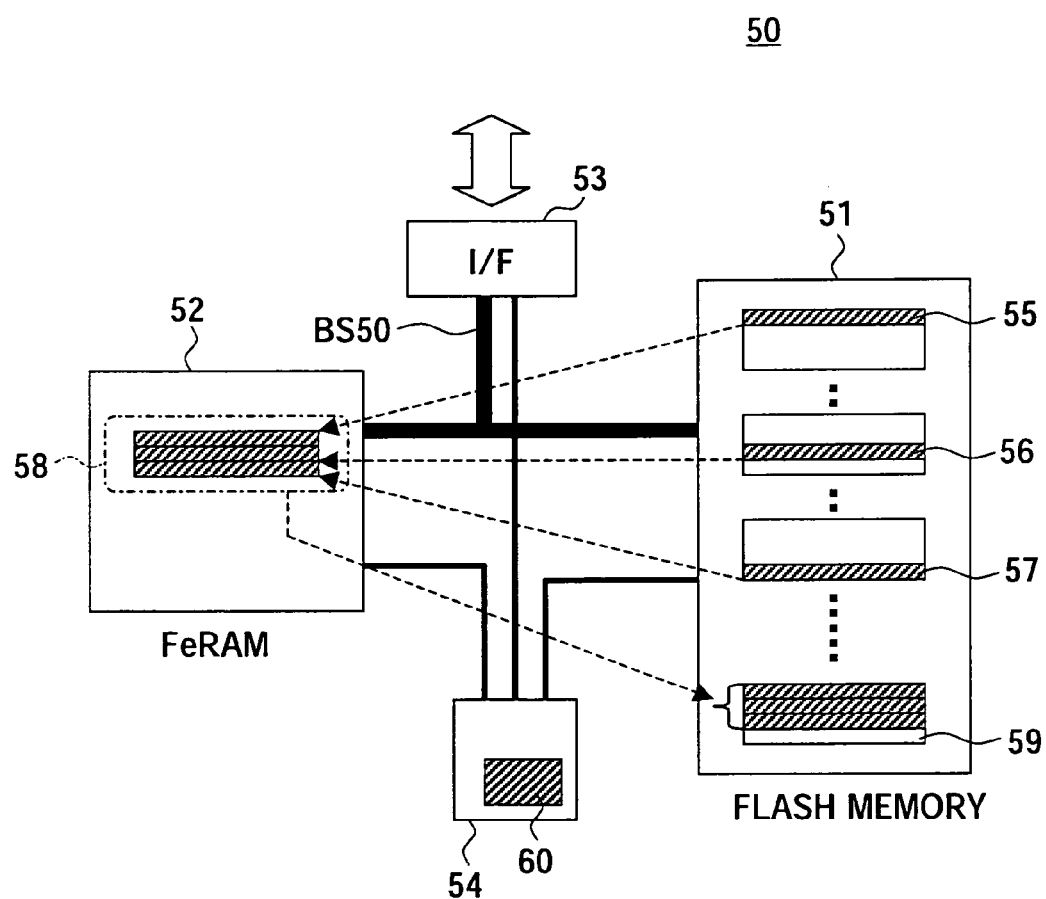
FIG. 6 is a view of the configuration showing a storage device according to a first embodiment of the present invention.

FIG. 6 is a view of the configuration of a storage device according to a first embodiment of the present invention.

A storage device 50 of FIG. 6 has, as principal components, a main memory 51, an auxiliary memory 52, an interface circuit (I/F) 53, a transfer control circuit 54, and an internal bus BS50.

That is, the storage device 50 is comprised of a large capacity main memory 51 configured by a NAND type flash memory and a relatively small capacity auxiliary memory 52 configured by a ferroelectric memory connected to an input/output interface circuit 53 with the outside via the internal bus BS50 and further has the transfer control circuit 54. The main memory 51 has an internal portion arranged in parallel at a high level, in which a group of data of 32 kB is simultaneously accessed as unit pages and input/output and transferred to the internal bus BS50.

Figure 7:
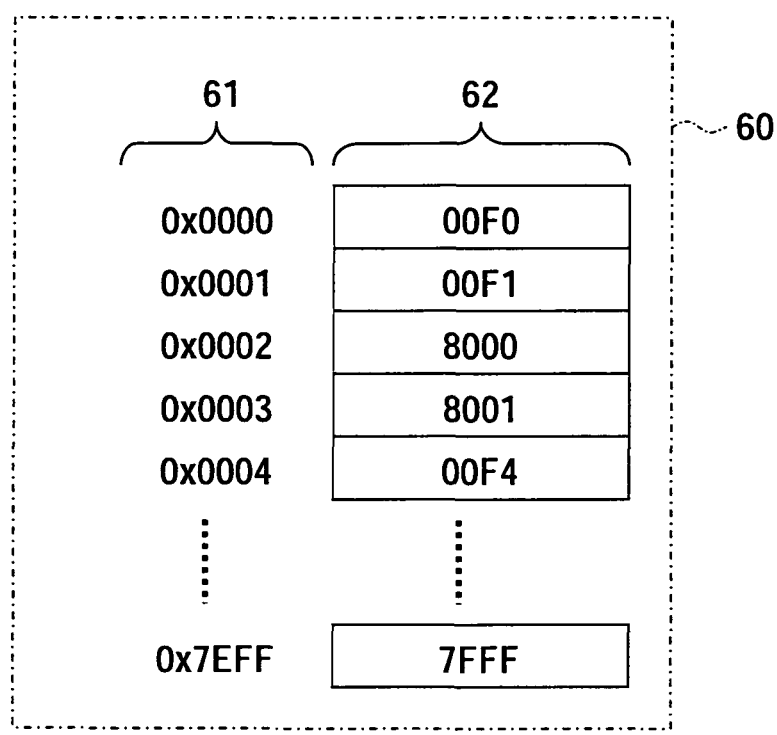
FIG. 7 is a diagram of an example of the internal configuration of a transfer control circuit of page data of FIG. 6.

Further, the device is formed with an address conversion table 60 using the above pages as management units. This is constructed in for example, as shown in FIG. 7, a RAM built in the transfer control circuit 54. The interface circuit 53 is provided with a page buffer of 32 kB inside it, acquires the data in units of pages from the internal bus BS50, and input/outputs the data in units of file sectors of 512 B via that.

When the desired sector address to be accessed is designated from the outside, the transfer control circuit 54 extracts the corresponding logic page address from its higher bits and refers to the address conversion table 60. The address conversion table 60, as shown in FIG. 7, is comprised of correspondence between logic addresses 61 and physical addresses 62 and enables correspondence with the memory addresses and the stored data on the RAM storing the table. Namely, by accessing the address on the RAM corresponding to the desired logic address, the corresponding physical address can be acquired.

Physical address regions 0000 to 7FFF indicate page addresses in the main memory 51. On the other hand, regions of 8000 or more indicate the auxiliary memory 52. For example, a physical address 8001 indicates that the desired page is present at the address 0001 of the auxiliary memory 52.

The transfer control circuit 54 judges the location of the desired page by using this table, reads it out from the main memory 51 or the auxiliary memory 52, and transfers it to the page buffer of the interface circuit 53.

The storage device 50 moves the page data read out from the main memory 51 and updated to the auxiliary memory 52. Namely, the transfer control circuit 54 stores the updated page in the auxiliary memory 52 and rewrites the physical address corresponding to the corresponding logic address in the address conversion table 60 to the destination of storage of the auxiliary memory 52. Due to this, the reading side region in the main memory 51 is invalidated. Namely, the page data is not copied to the auxiliary memory 52 serving as the temporary memory, but is moved.

After that, when the same logic address is accessed, the auxiliary memory 52 is accessed according to the updated address table. The rewriting of the FeRAM is carried out at a considerably higher speed than in the flash memory, therefore the data access to the auxiliary memory 52 can be executed at an extremely high speed. In this regard, the role of the auxiliary memory 52 is the same as that of the usual flash memory.

Assume that pages 55 to 57 read out from erase blocks different from each other are updated one after another in this way and move to the auxiliary memory 52. When there is no longer any empty region in the auxiliary memory 52 in this way, the transfer control circuit 54 has move these pages to the main memory 51 again. The movement at this time can be carried out to any erased region on the main memory unlike the writing back from the cache memory in the past. For example, the data may be moved to the erased empty block 59 all together. It is not necessary to perform the block erasing on the reading side and data evacuation of the entire block, and the rewriting with respect to pages as in the past case. Namely, only the group of pages 58 need be successively transferred from the auxiliary memory 52 to the block 59 of the main memory 51, and the address conversion table 60 need only be rewritten in accordance with that.

Note that the storage device in the present embodiment moves and stores pages to the auxiliary memory 52 from any positions of the main memory 51 at random, therefore an effect equivalent to a full associative cache memory having a high hit ratio can be exhibited. In addition, both of a comparison and updating of the address conversion table 60 used for a search and movement of the data may be carried out by one RAM access. This is far more convenient and higher in speed than the detection of a hit of a cache system scanning for example the cache TAG and comparing it with the input address.

It is also possible to use a volatile memory as the auxiliary memory 52 in the present embodiment, but the loss of the data is not permitted. Accordingly, it is necessary to provide a specific region in for example the main memory 51 and evacuate the content to that when the power supply is OFF. Further, when the power supply is ON, the retracted data must be restored, excess time is taken for activation and shutdown, and in addition there is susceptibility to momentary cutoffs of power. Accordingly, the auxiliary memory 52 is desirably a non-volatile memory performing access with a higher performance than that of the flash memory. Specifically, a memory using a ferroelectric material, phase change material, ferromagnetic material, or magnetoresistance effect material is desirable.

Further, loss of data is not permitted in the address conversion table 60 either. For example, when the logic address of each page is stored in the spare region for each page, restoration is possible, but a long time is taken for scanning all pages. Accordingly, desirably the table data is backed up in the non-volatile auxiliary memory 52 or directly constructed in the memory 52.

When moving data from the main memory 51 to the auxiliary memory 52, specifications for determining at which address the data is to be stored are necessary. Further, when there is no longer any empty region in the auxiliary memory 52, specifications for determining from which data to move to the main memory 51 are necessary.

Figure 8:
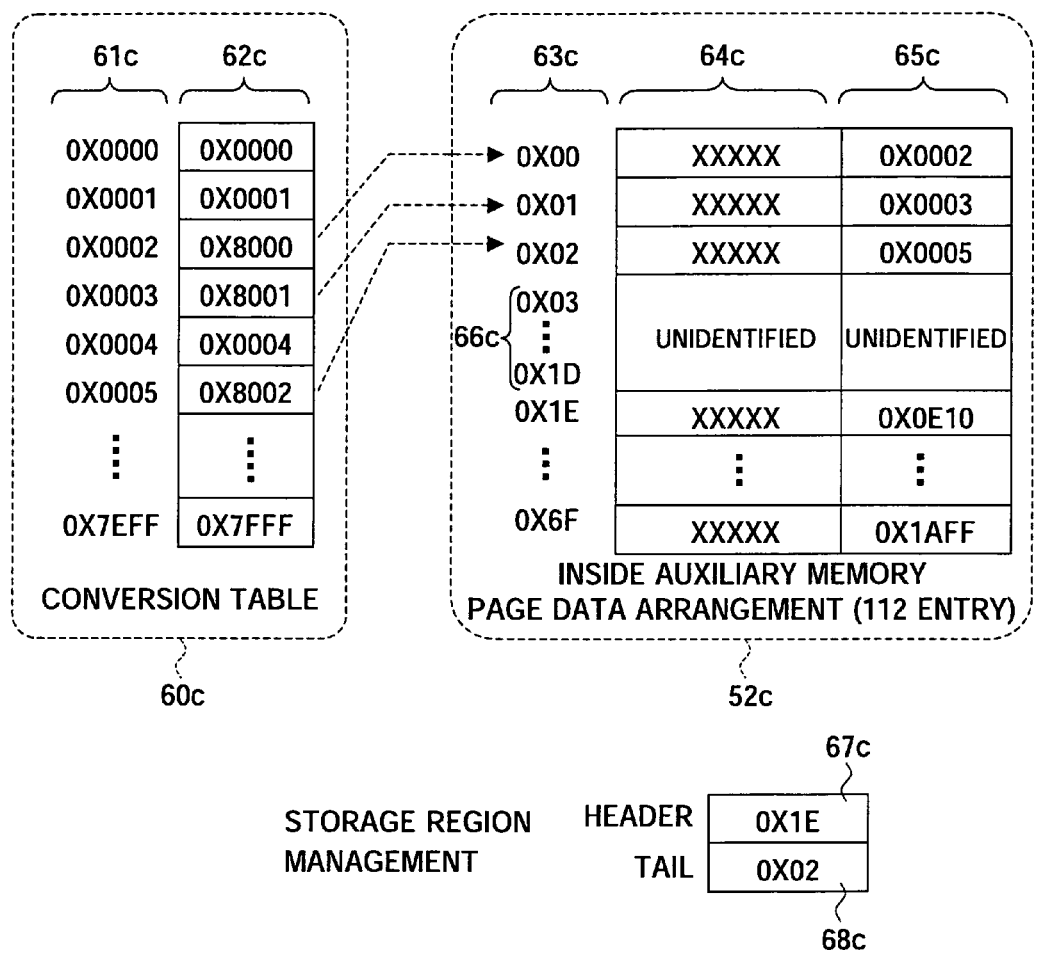
FIG. 8 is a diagram of a specific example of a management technique of an auxiliary memory.

A specific example of a management technique of such an auxiliary memory 52 is shown in FIG. 8. An address conversion table 60c carries physical page addresses corresponding to logic page addresses input to the storage device 50. "0x8000" or more indicate the data region in the auxiliary memory 52c. The lower 8 bits thereof become the index in the array of the page data constructed in the auxiliary memory 52c.

The auxiliary memory 52c includes for example 112 entry regions. Page data are managed in the array using the physical addresses as indexes. Namely, in the state of FIG. 8, the page data are stored in continuous regions from an index "0x1e" as a header up to "0x02". The region 66c from "0x03" to "0x1d" does not store data at present and becomes an empty region.

The header index "0x1e" to the tail index "0x02" in the page data storage region are stored and managed in registers 67c and 68c in a cache controller (corresponding to a notation (54) in FIG. 6). Further, the auxiliary memory 52c is provided with a spare field 65c corresponding to a field 64c for the page data for each index and stores the logic address of each page data there.

When storing new page data in the auxiliary memory 52c, the following operation is carried out. First, the value of the header index register 67c is decremented by 1 and becomes "0x1d". Then, the page data is stored in the page field corresponding to the index "0x1d" in the auxiliary memory 52c, and the corresponding logic address is stored in the spare field.

On the other hand, when there is no longer any empty region of the auxiliary memory 52c or the remainder becomes small and the existing page data is deleted from the auxiliary memory and moved to the main memory for securing a new empty region, the following operation is carried out.

First, the value of the tail index register 68c is referred to and the index value "0x02" is acquired. On the basis of this, the page data stored in the page field corresponding to the index "0x02" in the auxiliary memory 52c and the logic address value "0x0005" stored in the spare field are acquired. The page data is transferred to and stored in a suitable physical address in the main memory, for example "0x00FF" and, at the same time, the address conversion table 60c is accessed and the field corresponding to the logic address "0x0005" is rewritten from "0x8002" to "0x00FF". Further, the value of the tail index register 68c is decremented and changes to "0x01".

Namely, page data in the auxiliary memory 52c form pairs with corresponding logic addresses and are managed as an array. By referring to the logic addresses, when moving data from the auxiliary memory 52c to the main memory, it becomes possible to suitably and quickly access the corresponding position of the address conversion table 60c and rewrite that. Further, the storage index of new page data into the array and the moving side index where the old page data is moved are uniquely determined by a pushup algorithm.

Note that the array of the page data described above is constructed as follows on a 32 Mb memory in which 1 word is comprised of 16 bits. The memory has 2M words. Each word is selected by using 21 bits of memory address. Here, for page data use fields 64c, continuous regions of 16 k words are used. The entire regions are stored in memory address regions of:

"0_0000_0000_0000_0000_0000" to "1_1011_1111_1111_1111_1111".

Among them, the higher 7 bits are the values corresponding to indexes for selecting pages and are within a range of:

"0_0000_00" to "1_1011_11".

A hexadecimal value thereof corresponds to "0x00" to "0x6f". The lower 14 bits become addresses when extracting the data from the same page in unit of words.

On the other hand, each word is used for each spare field 65c. All of them are stored in the memory address regions of:

"1_1100_0000_0000_0000_0000" to "1_1100_0000_0000_0110_1111".

Here, the lower 7 bits correspond to the page indexes as they are.

Namely, when any page index is given, by assigning it to the higher 7 bits of the memory address and scanning the lower 14 bits as "00_0000_0000_0000" to "11_1111_1111_1111", the desired page data use field 64c can be accessed. Further, by assigning it to the lower 7 bits and adding "1_1100_0000_0000_0" to the higher 14 bits, the spare field 65c can be accessed. Note that, this is just an example. There may be various variations in the technique of specifically configuring the array of the page data on the memory.

Figure 9:
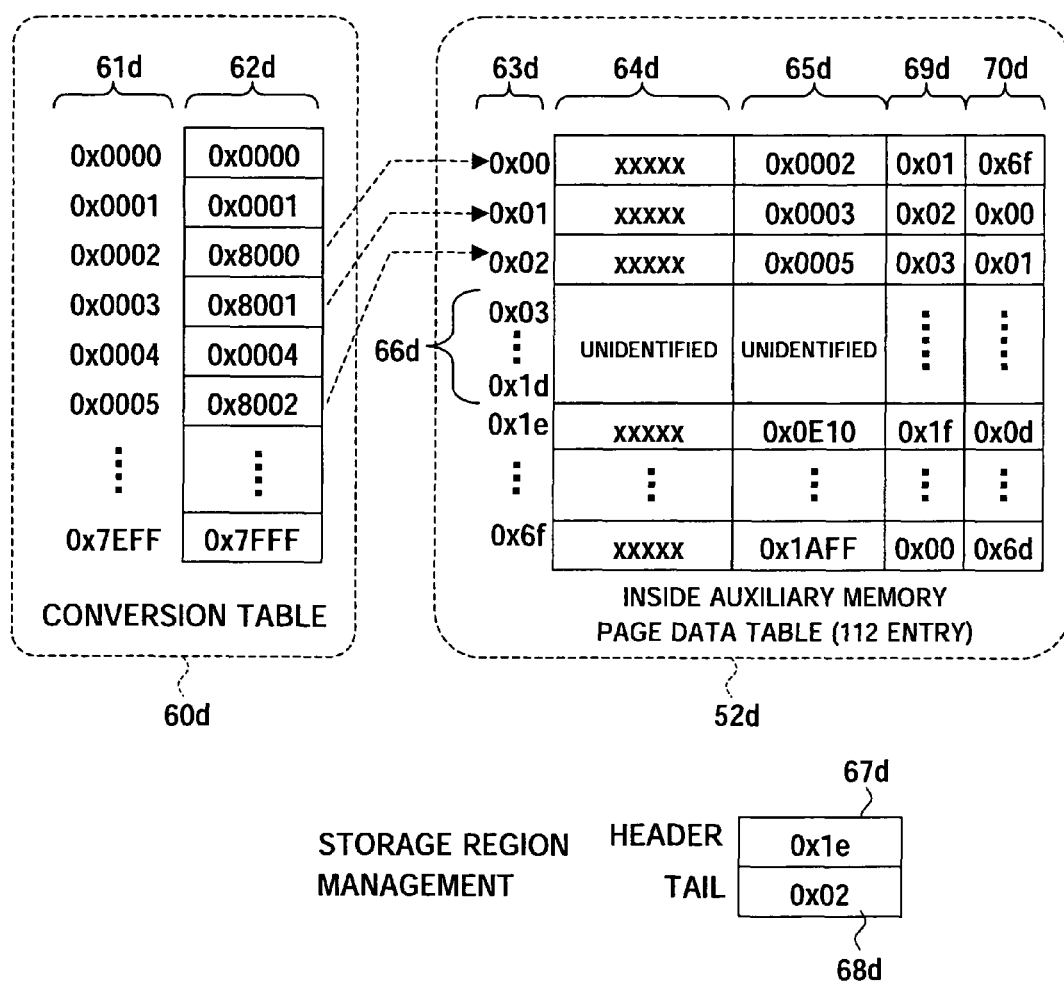
FIG. 9 is a diagram of a specific example of a second management technique of an auxiliary memory.

An example of a second management technique using a link list for the auxiliary memory is shown in FIG. 9. An address conversion table 60d carries physical page addresses corresponding to logic page addresses input to the storage device. "0x8000" or more designate the data regions in the auxiliary memory 52d. The lower 8 bits thereof become indexes in the link table of the page data constructed in the auxiliary memory 52d.

The auxiliary memory 52d has 112 entry regions. The page data is managed by the link list using the physical addresses as indexes. Indexes of nodes linked backward are stored in a field 69d, and indexes of nodes linked forward are stored in a field 70d. In the state of the figure, the linkage is successively and continuously carried out up to "0x02" while defining the node of the index "0x1e" as the header so as to store the page data. The region 66c from "0x03" to "0x1d" does not store data at present and becomes an empty region. Note the linkage is laid so as to circulate once around all nodes.

The header index "0x1e" and the tail index "0x02" of the nodes storing the page data therein in the link list are stored and managed in the registers 67d and 68d in the cache controller (corresponding to (54) of FIG. 6). Further, in the cache memory 52d, a spare field 65d corresponding to the field 64d for the page data is provided for each index. The logic address of each page data is stored there.

When new page data is stored in the auxiliary memory 52d, the following operation is carried out.

First, the index value "0x1e" stored in the header index register 67d is accessed, and the index "0x1d" of the forward node is acquired from the value of the field 70d. Then, the page data is stored in the page field corresponding to the index "0x1d" in the auxiliary memory 52d, and the corresponding logic address is stored in the spare field. Further, the value of the header index register 67d is rewritten to "0x1d".

On the other hand, when there is no longer any empty region of the auxiliary memory 52 or the remainder becomes small and existing page data is deleted from the auxiliary memory and moved to the main memory in order to secure a new empty region, the following operation is carried out.

First, the value of the tail index register 68d is referred to, and the index value "0x02" is acquired. The index value "0x02" in the auxiliary memory 52d is accessed based on this, and the page data stored in the page field, the logic address value "0x0005" stored in the spare field, and the index value "0x01" of the forward link are acquired. The page data is transferred to and stored at the appropriate physical address in the main memory, for example "0x00FF", the address conversion table 60d is accessed, and the field corresponding to the logic address "0x0005" is rewritten from "0x8002" to "0x00FF". Further, the value of the tail index register 68d changes to the index value "0x01" of the forward link node.

Namely, page data in the auxiliary memory 52d form pairs with corresponding logic addresses and are managed as an array. By referring to these logic addresses, when the data is moved from the auxiliary memory 52d to the main memory, it becomes possible to suitably and quickly access the corresponding position of the address conversion table 60d and rewrite that. Further, the storage index of the new page data into the array and the moving side index where the old page data is moved are uniquely determined according to the algorithm of inputting the data from the header node of the link and discarding the data from the tail node of the link.

Note that it is not always necessary to link to continuous indexes in such link list management. Further, by rewriting the fields 69d and 70d, it is possible to dynamically change the link and change the order of nodes to be discarded.

Specifically, when data already stored in the auxiliary memory 52d is accessed again, if the header of the link is replaced by this, data having a high access frequency will remain in the high speed auxiliary memory for a very long time, so the hit ratio of the auxiliary memory will be improved.

Figure 10:
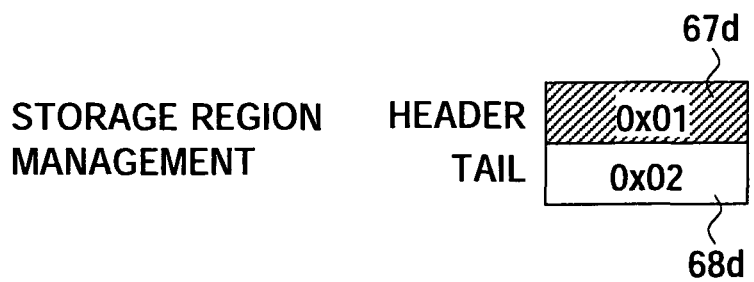
FIG. 10 is a diagram of an example of attaching a node having an index "0x01" to the head from the state of FIG. 9.

FIG. 10 shows an example of attaching the node of index "0x01" to the header from the state of FIG. 9. By rewriting the hatched field, the order of the linkage changes, only "0x01" changes from the general position, and the front of the previous header node "0x1e" is replaced. Also, the value of the header index register (67d) is rewritten to "0x01" accompanied with that.

Second Embodiment

Figure 11:
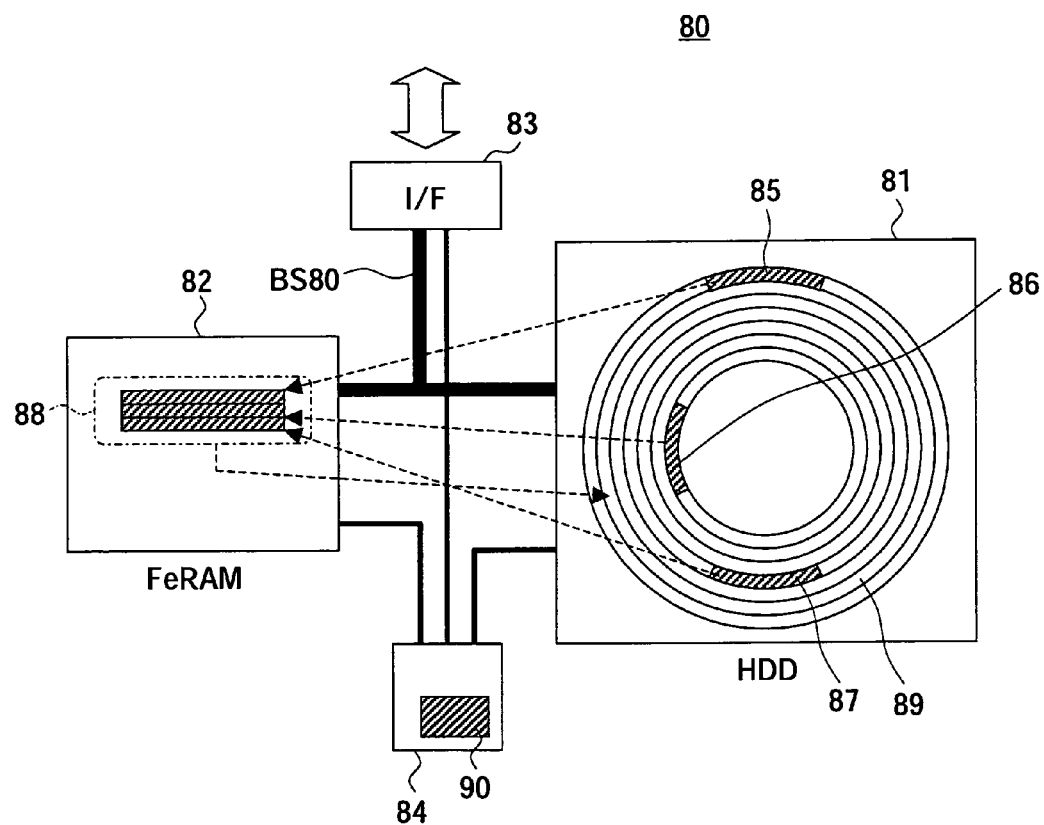
FIG. 11 is a view of the configuration of a storage device according to a second embodiment of the present invention.

FIG. 11 is a view of the configuration showing a storage device according to a second embodiment of the present invention. A storage device 80 of the second embodiment is a storage device using a hard disk drive (HDD) as the main memory.

The storage device 80 of FIG. 11 has a main memory 81, an auxiliary memory 82, an interface circuit (I/F) 83, a transfer control circuit 84, and an internal bus BS80 as principal components.

The input/output interface circuit 83 with the outside is connected to a large capacity main memory 81 configured by a hard disk drive and a relatively small capacity auxiliary memory 82 configured by a ferroelectric memory via the internal bus BS80 and further has a transfer control circuit 84. According to the control signal from the transfer control circuit 84, the main memory 81 and the auxiliary memory 82 transfer data in two ways in the data group in units of for example 32 kB (hereinafter referred to as a "page"). Further, the data is transferred in units of 512 B corresponding to the file sector between the interface circuit 83 and the auxiliary memory 82.

Figure 12:
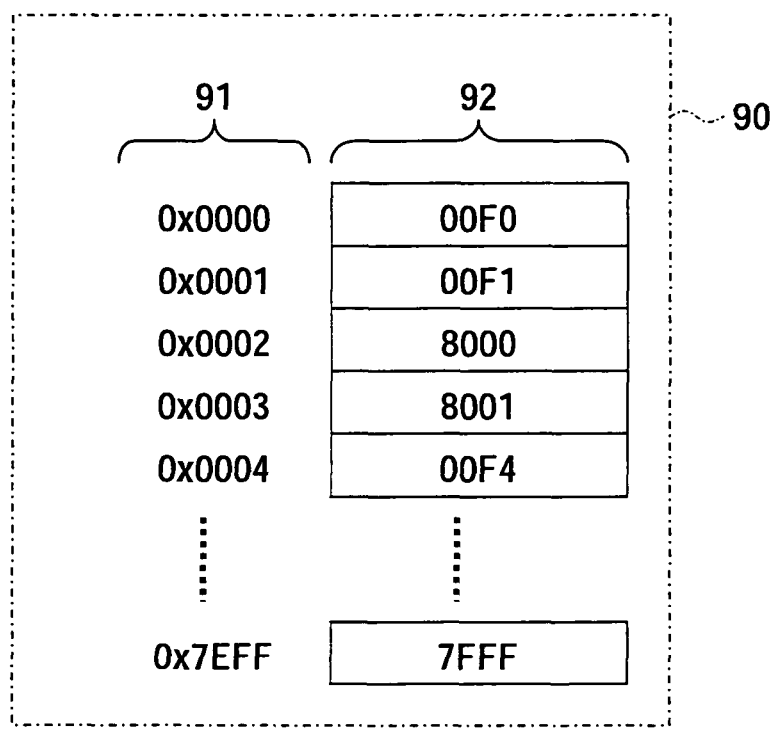
FIG. 12 is a diagram of an example of the internal configuration of a transfer control circuit of page data of FIG. 11.

In the storage device 80 of FIG. 11, when the desired sector address to be accessed is designated from the outside, the transfer control circuit 64 extracts the corresponding logic page address from the higher bits thereof and refers to an address conversion table 90 constructed in the built-in RAM as shown in FIG. 12. The address conversion table 90 is comprised of the correspondence of logic addresses 91 and physical addresses 92. Physical address regions 0000 to 7FFF of FIG. 12 indicate the page addresses in the main memory 81. On the other hand, regions of 8000 or more indicate the auxiliary memory 82. For example, the physical address 8001 indicates that the desired page is present at the address 0001 of the auxiliary memory 82.

The transfer control circuit 84 judges the location of the desired page by using this table. When the data is present in the auxiliary memory 82, the transfer control circuit 84 transfers the corresponding address in the auxiliary memory 82 to the interface circuit 83 and permits access. On the other hand, when the data is present in the main memory 81, the corresponding page of the main memory 81 is moved once to the auxiliary memory 82. Namely, the transfer control circuit 84 transfers the corresponding page to the empty region of the auxiliary memory 82 from the main memory 81 and rewrites the physical address corresponding to the corresponding logic address in the address conversion table 90 to the storing side of the auxiliary memory 82. Due to this, the reading side region in the main memory 81 is invalidated. Namely, the page data is not copied to the auxiliary memory 82 serving as the temporary memory, but is moved. Suitably thereafter, the corresponding address in the auxiliary memory 82 is transferred to the interface circuit 83 to permit access.

After that, when the same logic address is accessed, the auxiliary memory 82 is accessed according to the updated address table. The reading and writing of the FeRAM are carried out at a considerably higher speed than the hard disk drive requiring seeking of the head, therefore the data access to the auxiliary memory 82 can be executed at an extremely high speed.

Assume that pages 85 to 87 read out from tracks different from each other in the main memory 81 move to the auxiliary memory 82 one after another in this way. When there is no longer an empty region in the auxiliary memory 82, the transfer control circuit 84 has to move these pages to the main memory 81 again. The movement at this time can be carried out to an empty region of any track on the main memory or a group of any tracks close to each other unlike the writing back from the general cache memory. For example, the group of pages 88 move to the same track 89. Accordingly, the seeking of the head at that time is suppressed to the lowest limit, and the data can be moved at a high speed.

What is stored in the auxiliary memory 82 is the group of page data having a deep relation with each other. For example, in the FAT or other file system, when a file stored in the main memory 81 and divided into fragments is accessed, a plurality of file fragments move from tracks different from each other to the auxiliary memory 82. They are written into the same or close tracks when they are moved to the main memory 81 again. Accordingly, when these are accessed next, the seeking of the head can be kept to the lowest limit.

Namely, when the present embodiment is employed, an effect equivalent to a de-flag operation which had to be carried out by a user over a long time by using a personal computer etc. will be automatically obtained during the memory access. In addition, not only is the file divided into fragments, but also a plurality of files related to the same application move to the close tracks and a high speed access with a small head seeking becomes possible next time.

Note that in the second embodiment, for the same reason as that of the first embodiment, desirably the auxiliary memory 82 is a non-volatile memory performing a high performance access. A memory using a ferroelectric material, phase change material, ferromagnetic material, or magnetoresistance effect material is more desirable.

Further, for the address conversion table 90 as well, desirably the data is backed up in the non-volatile auxiliary memory 82, or directly constructed in the auxiliary memory 82.

Note that when the capacity of the hard disk drive or other main memory 81 becomes huge, the number of stored pages becomes large and the memory capacity required for constructing the table 90 becomes huge. It is known that, with respect to this, a method of dividing the table to a plurality of sections corresponding to the higher bits of the logic page address is effective. First, by selecting the corresponding table from the higher bits and accessing the corresponding table according to the lower bits, the corresponding physical page address is obtained. In this way, there is also variation in the form of the address conversion table, but the present invention can be applied to any case.

Third Embodiment

Even when apply part of the concept of the present invention to an existing cache memory system, it is possible to obtain similar effects. An explanation will be given of the configuration of a storage device managing an auxiliary memory as a cache memory as a third embodiment for a system the same as that of the embodiment of FIG. 6.

Figure 13:
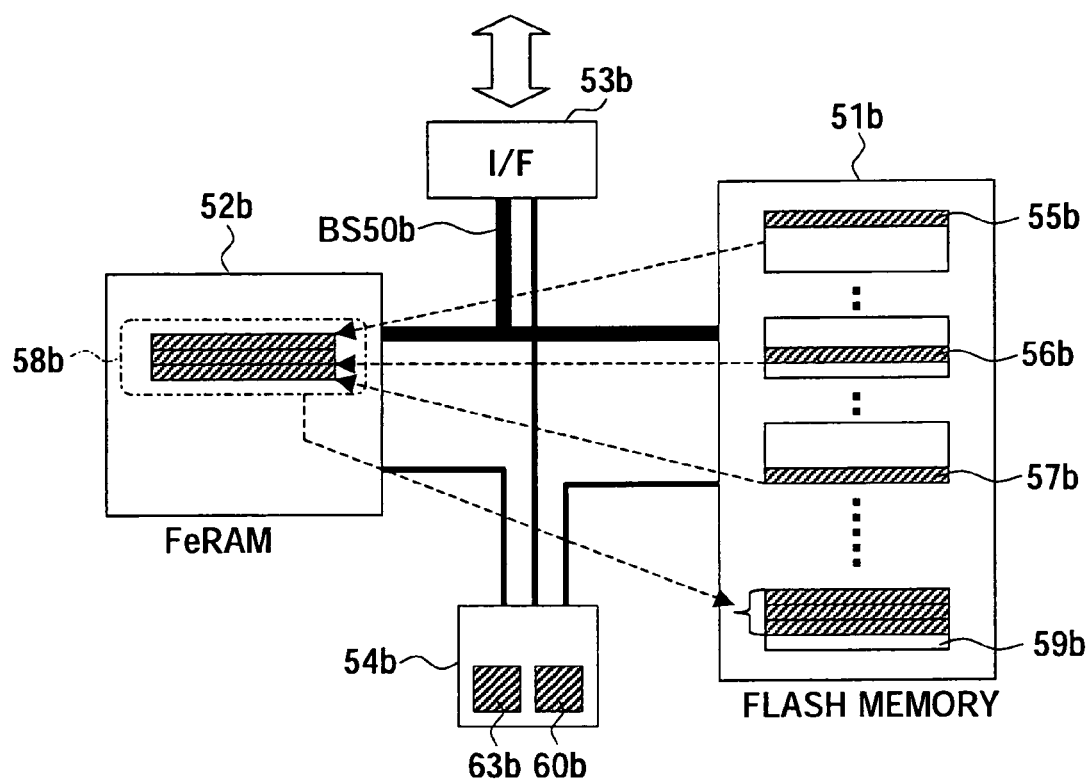
FIG. 13 is a view of the configuration of a storage device according to a third embodiment of the present invention.

FIG. 13 is a view of the configuration of a storage device according to a third embodiment of the present invention.

A storage device 50B of FIG. 13 has a main memory 51b, an auxiliary memory 52b, an interface circuit (I/F) 53b, a transfer control circuit 54b, and an internal bus BS50b as the principal components.

Figure 14:
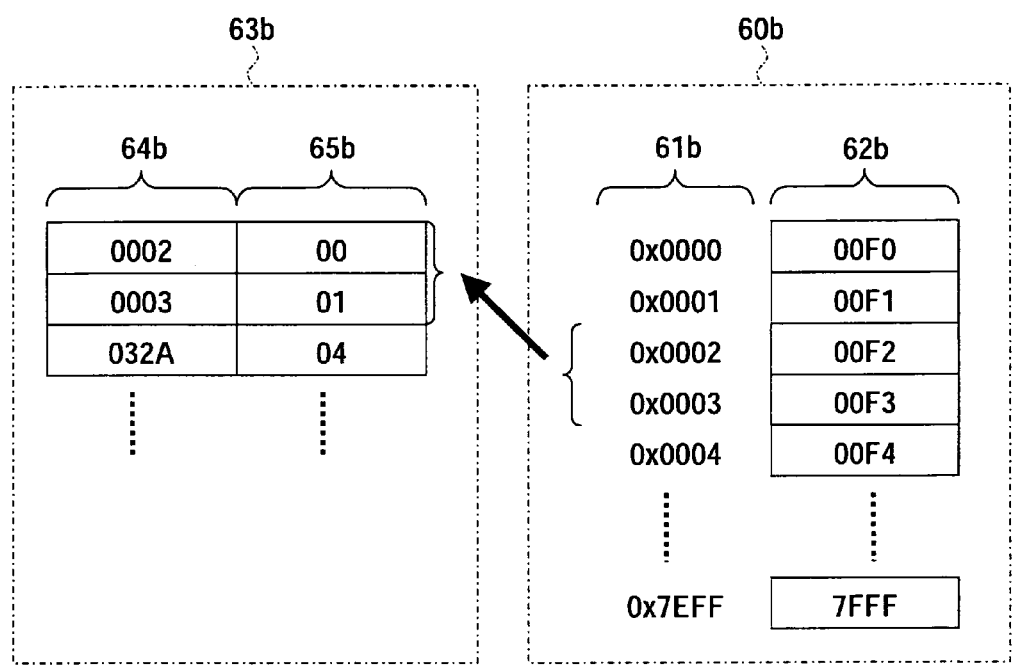
FIG. 14 is a diagram of an example of the internal configuration of a transfer control circuit of page data of FIG. 13.

In such a memory system, a page table 60b is used for only management of the main memory 51b. The physical address covers only the region on the main memory 51b side. On the other hand, the content on the auxiliary memory side is managed by separately providing an entry table 63b of the cache as shown in FIG. 13 and FIG. 14 and using this for management. Namely, the auxiliary memory 52b is positioned as the cache memory.

In the storage device 50B, the page data read out from the main memory 51b and updated is temporarily copied to the cache memory 52b. Namely, in the present example, the address table 60b is not updated, but the entry to the cache is separately added to the table 63b. For example, the table 60b shows that page data corresponding to the logic addresses 0x0002 and 0x0003 are stored at address positions of 0x00F2 and 0x00F3 of the main memory 51b. On the other hand, a set of the logic address 64b of the page copied into the cache and the in-cache physical address 65b thereof is entered in the table 63b. Namely, it is seen that copies of the page data corresponding to the logic addresses 0x0002 and 0x0003 explained above are stored at 0x00 and 0x01 of the cache memory 52b.

Thereafter, when the same logic address is accessed, a hit of the cache is detected by the scanning of the entry of the table 63b, and the cache memory 52b is accessed.

Assume that the pages 55b to 57b read out from erase blocks different from each other are updated one after another in this way and that copies thereof are temporarily stored in the cache memory 52b. In this way, when there is no longer any empty region in the cache memory, it is necessary to reflect the updating of these pages in the main memory 51b and discard the data in the cache. The transfer control circuit 54b moves the physical positions in the main memory of the corresponding page data to for example the erased empty block 59b at this point of time. Namely, the transfer control circuit 54b successively transfers the group of pages 58b from the cache memory 52b to the block 59d of the main memory 51b and rewrites the address table 60b in accordance with that. Further, it deletes the corresponding entry from the table 63b.

In the third embodiment, the management technique is different from that of the first embodiment, but the routine for transfer of the page data is the same. Accordingly, an effect similar to that of the first embodiment can be obtained. In this case, however, double management of the cache TAG table 63b and the page table 60b is redundant and troublesome. Further, an excess time is taken for judgment of hits by scanning the TAG. Accordingly, such a system can be understood as a transitional middle stage before reaching the first embodiment.

Fourth Embodiment

The content of the present embodiment was briefly conceptually explained above. Further, a detailed explanation will be given below of the functional configuration and method of operation for a fourth embodiment further developed from the memory configuration in the first embodiment in order to specifically clarify the feasibility of an ultra-high speed silicon disk according to the present invention.

Figure 15:
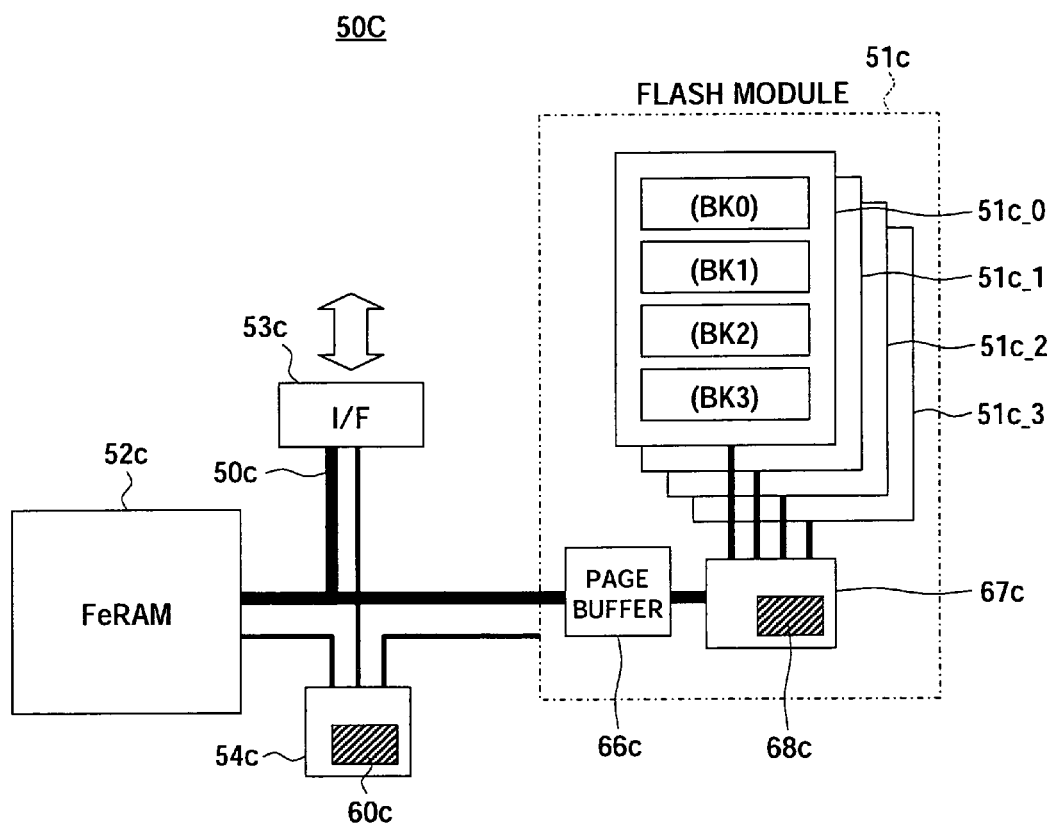
FIG. 15 is a view of the configuration of a storage device according to a fourth embodiment of the present invention.

FIG. 15 is a view of the configuration of a storage device according to a fourth embodiment of the present invention.

A storage device 50C of FIG. 15 has a main memory 51c, an auxiliary memory 52c, an interface circuit (I/F) 53c, a transfer control circuit 54c, and an internal bus BS50c as the principal components.

The main memory 51c of the present storage device 50C is a flash memory module 51c and includes four 256 MB flash memories 51c_0 to 51c_3 able to perform parallel operation, a flash memory controller 67c, and a page buffer 66c.

The flash memories 51c_0 to 51c_3 each have four 64 MB memory arrays, for example, banks BK0 to BK3, which can perform parallel operation as banks independent from each other. The page size of each of the banks BK0 to BK3 is 2 kB, and the erase block size is 128 kB for 64 pages all together. Namely, the banks BK0 to BK3 have 512 erase blocks. Further, each bank has a page storage latch. The write transfer speed of each bank is about 10 MB/s. When writing the data in the banks BK0 to BK3, each data of 2 kB corresponding to the page size is transferred into the latch for each bank at first, and the data are written at the desired page addresses all together after that. The banks BK0 to BK3 can designate page addresses to be independently accessed, can transfer the data to the latches of opposite banks during a period when the banks on one side are written with data, and further can start the writing. Namely, four banks can perform parallel operation.

Further, four flash memories can perform the parallel operation, and the entire flash memory module can access 16 banks in parallel. For example, when one file is divided into 16 banks and written with data in parallel, writing substantially at 16× speed at the maximum is possible. It is possible to integrally form them to appear as a flash memory having a page size of (2 kB×16=) 32 kB, an erase block size of (128 kB×16=) 2 MB, and a write transfer speed of (10 MB×16=) 160 MB/s.

A flash memory controller 67c is provided with an error correction circuit using ECC encoding. In the built-in RAM, an address conversion table (block address table) 68c is formed in units of erase blocks (here, 2 MB blocks integrally comprised of 16 banks).

The address conversion table 68c is actively used when performing processing for restoration of invalid pages explained later, the search for the optimum write region, the averaging of the number of rewrites for each block, etc.

Further, the flash memory module 51c is provided with a page buffer 66c of 32 kB. Transfer of data with the internal bus BS50c is carried out via this. At the time of the data reading, 32 kB worth of the page data is output from the internal flash memories arranged in parallel at a high level to the page buffer. Further, at the time of writing, the data of the page buffer is written into banks of the flash memory in a divided manner.

The entire storage device 50C is configured by connecting the large capacity flash memory module 51c and the relatively small capacity auxiliary memory 52c made of the ferroelectric memory to the input/output interface circuit 53c with the outside via the internal bus BS50c. Further, it has the transfer control circuit 54c. An address conversion table 60c using a page of 32 kB as management units is constructed in the built-in RAM.

Figure 16:
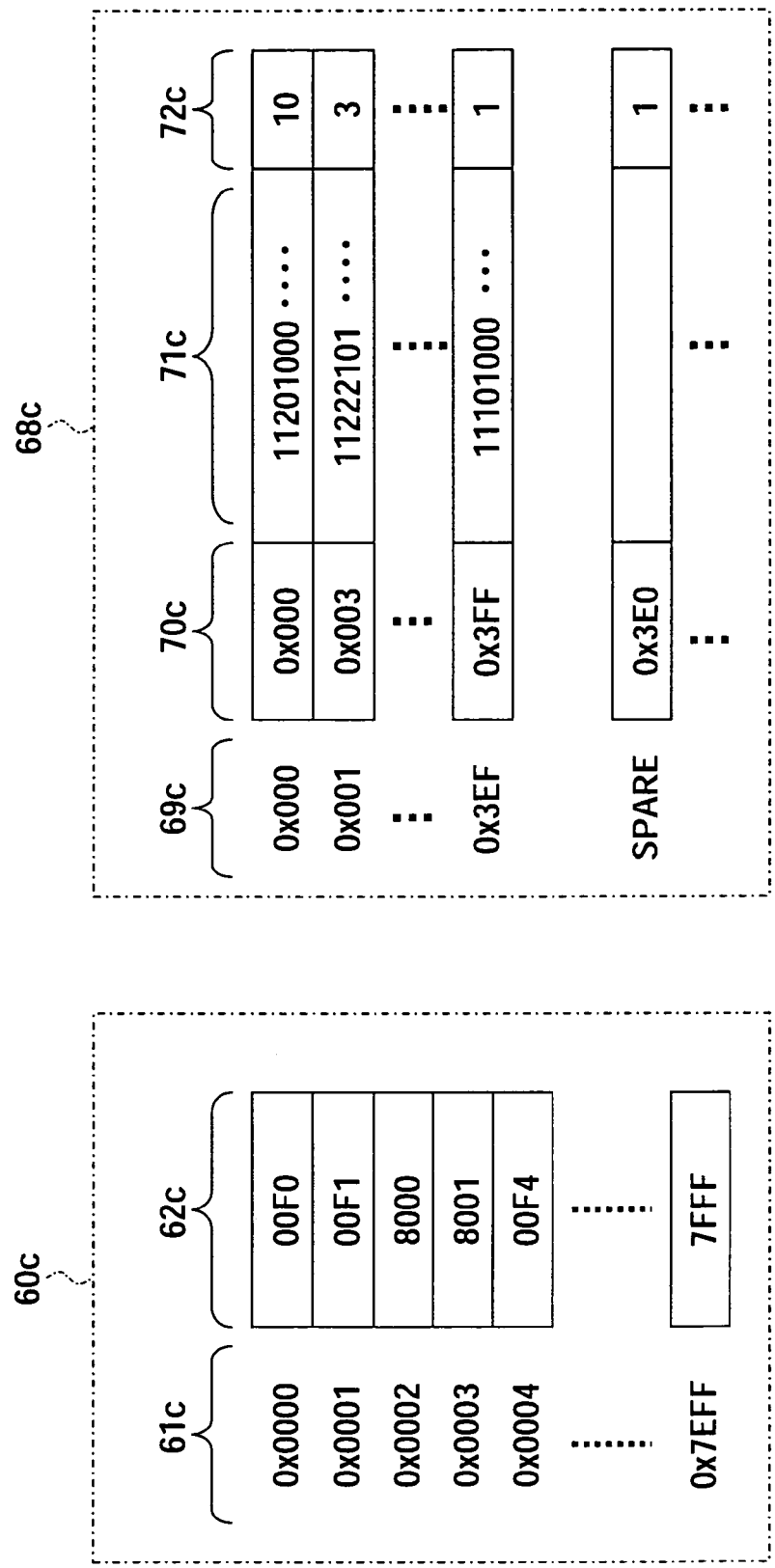
FIG. 16 is a diagram of an example of the internal configuration of a transfer control circuit of page data of FIG. 15.

When the sector address desired to be accessed is designated from the outside, the transfer control circuit 54c extracts the corresponding logic page address from its higher bits and refers to the address conversion table 60c. The address conversion table 60c, as shown in FIG. 16, is comprised of the correspondence of the logic addresses 61c and the physical addresses 62c and enables correspondence with the memory addresses and the stored data on the RAM storing the table. Namely, by accessing the address on the RAM corresponding to the desired logic address, the corresponding physical address can be acquired. The physical address regions 0000 to 7FFF indicate page addresses in the main memory 51c. On the other hand, 8000 or more regions indicate the auxiliary memory 52c. For example, the physical address 8001 indicates that the desired page is present at the address 0001 of the auxiliary memory 52c. The transfer control circuit 54c judges the location of the desired page by using this table. Further, the lower bits determine the position of the sector in the page.

When reading data, when the desired page is present in the main memory 51c, the IF circuit 53c selects any file sector (capacity is 512 B) from among data of 32 kB output to the page buffer 66c and outputs the same to the outside of the device. Further, when the desired page is present in the auxiliary memory 52c, the auxiliary memory 52c is directly accessed by using the converted address, and the data of the desired file sector is output via the IF circuit 53c.

On the other hand, when writing data, when the desired page is present in the main memory 51c, the transfer control circuit 54c first moves the corresponding page to the auxiliary memory 52c. Namely, the page data is transferred via the page buffer 66c to the auxiliary memory 52c. Further, the physical address corresponding to the corresponding logic address in the address conversion table 60c is rewritten to the destination of storage of the auxiliary memory 52c. Due to this, the reading side region in the main memory 51c is invalidated. Namely, the page data is not copied to the auxiliary memory 52c serving as the temporary memory, but is moved.

Next, on the auxiliary memory 52c, the data is updated in units of the file sectors. When the desired page is present on the auxiliary memory 52c, the auxiliary memory 52c is directly accessed by using the converted address, and the data is written.

Assume that many pages move to the auxiliary memory 52c accompanied with the updating in this way. When there is no longer any empty region in the auxiliary memory 52c, the transfer control circuit 54c has to move these pages to the main memory 51c again. The movement at this time can be carried out to any erased region in the main memory unlike with the writing back from a cache memory in the past.

In the fourth embodiment, the transfer control circuit 54c sends a command inquiring about the optimum destination of transfer to the main memory 51c preceding the movement and successively moves page data to the page addresses acquired there. Namely, the page data is successively transferred from the auxiliary memory 52c to the main memory 51c and the address conversion table 60c is rewritten in accordance with that.

The main memory (memory module) 51c has the following two functions in relation to the present embodiment other than the functions as a usual flash memory module.

1. The optimum empty region is retrieved before module becomes the destination of movement of a page and the page is written.
2. When the origin of movement of a page and many invalid regions are generated, they are restored to new empty regions.

For this work, the above block address table 68c is actively used. Details thereof will be explained below. The table 68c describes the status for each block in a table corresponding to the logic address 69c of each erase block at the memory module (main memory) 51c level.

For example, when reading the data from the storage device 50C, the transfer control circuit 54c acquires the physical address of the corresponding page by comparing the input address from the outside against the page address conversion table 60c. When the desired page is present in the memory module 51c, that becomes the page address input to the memory module 51c. Here, the memory module 51c acquires the block address from its higher bits. The address becomes the logic address at the memory module level.

Namely, the block address is converted at the block address table 68c again, and the corresponding physical block address 69c, the statuses flag 70c of the pages in that, and further the number of times 71c of block rewrites are acquired. The physical block address 69c indicates the location for selecting the block inside the memory module 51c.

The status flags 70c are two-bit flags describing whether the page is in (0) an erased state, (1) a state where valid data is stored, or (2) a state where data is invalidated for all of the 64 pages in the corresponding block. The status changes in an order of (0)→(1)→(2). The transition from (0)→(1) is updated for the corresponding page when the memory module is written in. The transition of (1)→(2) occurs when a page moves to the auxiliary memory 52c. This is updated in accordance with whether a movement command different from the usual reading is input from the transfer control circuit 54c, or an invalidation command of the designated page is input. The status (2) is returned to the status (0) by the restoration processing inside the memory module explained later.

Further, the total number of rewrites is recorded in the number of times 71c of block rewrites. In the case of a flash memory, the rewrite durability of the block is 100,000 times to 1,000,000 times, therefore this is indicated by a numerical value of about 18 bits.

Among the additional functions of the memory module described above, the optimum empty region retrieval is executed as in for example the following way.

The transfer control circuit 54c inputs the command for retrieval of the optimum page to the memory module 51c preceding the movement of the page from the auxiliary memory 52c. The control circuit 67c of the memory module receiving that scans the block address table 68c from the header. The block having the largest number of erased pages and having a small number of invalid pages is selected as the optimum block. Then, the logic address of the erased page region at the head thereof is notified as the optimum address of the destination of movement to the transfer control circuit 54c.

Further, when the target block is selected in this way, in the region selection after that, the erased pages in the same block are continuously successively selected until all of the erased pages in that block become valid pages.

When successively writing the data from the auxiliary memory 52c into the page region selected along with such an algorithm, pages having deep relations with each other are concentrated at the same block. They have a high possibility of being moved to the auxiliary memory 52c all together even when they are updated again. As a result, invalid pages also become concentrated at the same block. Due to that, the restoration processing explained next can be efficiently executed. This generates a block to which the erased pages are concentrated again.

Next, an explanation will be given of the restoration of invalid pages.

As pages on the memory module 51c are updated, they move to the auxiliary memory 52c along with that, and the original regions are invalidated, the invalid regions increase in the memory module 51c. The regions cannot be newly overwritten with data, therefore it is necessary to perform processing to restore them so that data storage becomes possible there at a certain point of time.

Figure 17:
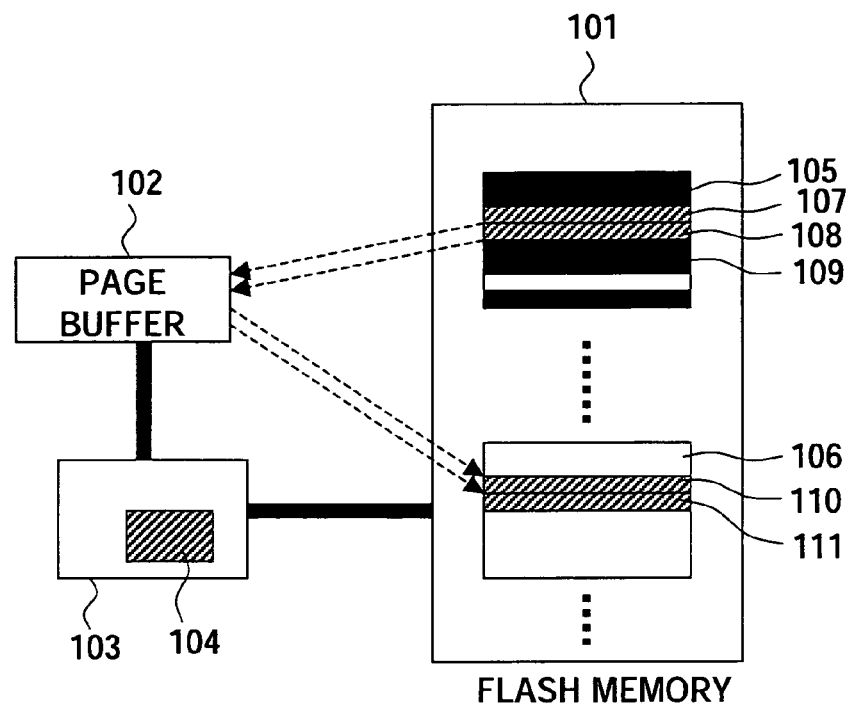
FIG. 17 is a diagram for explaining an example of execution of processing for restoration of invalid regions in the fourth embodiment.

FIG. 17 is a diagram for explaining an example of execution of the processing for restoration of the invalid regions. In FIG. 17, the group of memory arrays of FIG. 15 is expressed as one flash memory 101 for simplification. Further, the memory module, in the same way as FIG. 15, is provided with a flash control circuit 103 in which a block address table 104 is constructed and a page buffer 102.

In the erase block 105 in the flash memory 101, all pages except two valid pages 107 and 108 and one already erased page 109 are invalidated. On the other hand, 106 indicates a spare block from which all pages are erased. Namely, the memory 101 is provided with a spare block which does not correspond to any logic address on the block address table 104 and cannot be accessed from the outside.

Here, the control circuit 103 copies valid pages 107 and 108 to the same page positions of the spare block 106 via the page buffer 102. Further, it updates the internal block address table 104 and changes the destination of correspondence of the logic addresses mapped in the block 105 to the block 106. By this, all of the invalid pages are restored to the erased pages and new data can be written. On the other hand, the block 105 becomes the spare block after being erased.

Such processing is efficiently carried out when the block having the largest number of invalidated pages and having a small number valid pages is retrieved, and the processing is applied with respect to that block. Accordingly, when the empty region in the memory becomes smaller, in the same way as the time of retrieval of the page of the destination of movement, the block address table may be scanned, the optimum block may be detected, and the restoration processing may be applied to that.

Note that, in the case of a non-volatile storage device, it is necessary to also store the content of the block address table 104. For this, for example a spare region is provided for each page data. The logic address of the block to which the data belongs, the status of the page, and the number of times of erasure of the block to which the data belongs are recorded there. By this, by scanning all pages at the time of turning on the power, it becomes possible to re-construct the table. Further, in order to shorten the activation time, desirably a specific region is provided in the flash memory 101, and the table content is backed up there when the power supply is OFF. In that case, at the time of ordinary activation, the table is reconstructed from the backup. In the case where there is no backup due to shutdown of the power and the case where some sort of problem occurs on the middle, all pages are scanned to reconstruct the table.

An example of the method of efficiently selecting the page region of the destination of movement of the data and the method of restoring invalid pages with a high efficiency were shown above. For the selection of a page as the destination of movement and the restored block, various algorithms can be considered. For example, the number of rewrites is considered and they are averaged. In any case, the flexibility enabling such optimization is one of the major effects which can be obtained by the present invention.

Further, as shown in FIG. 15 and FIG. 17, inside the storage device in the fourth embodiment, both of (1) transfer control at the storage device level by the control circuit 54c using the page address table 60c and (2) various control at the memory module 51c level by the control circuit 67c using the block address table 68c are independently executed while communicating with each other.

Such a configuration simplifies the algorithm of various control, therefore is preferred for drawing out the effects of the present invention. Further, it also contributes to higher efficiency of the operation per se of the system. For example, even during while processing for restoration of invalid pages is carried out in the memory module 51c, it is possible to freely access the data from the outside so long as the data is in the auxiliary memory 52c.

Note that the discrimination as explained above is carried out at the function level, but when actually realizing a storage device of the present embodiment, it is configured by three chips, that is, a ferroelectric memory chip, a flash memory chip, and a controller chip. The interface circuit 53c, the transfer control circuit 54c, the page buffer 66c, and the control circuit 67c are mounted on the controller chip in a composite manner. In that case, control becomes easier if different CPUs are used for control of (1) and (2) described above or one CPU is used in multi-thread manner and the threads are allocated to control of (1) and (2).

Further, when introducing the storage device of the embodiment of the present invention into an actual computer or home electric appliance, various configurations can be considered. For example, the embodiment of the present invention can be applied hierarchically by using three of the hard disk, flash memory, and ferroelectric memory as well. In that case, the following plurality of modes may occur.

The storage device of the embodiment of the present invention constructed by a flash memory (main) and a ferroelectric memory (auxiliary) is used as the cache memory of a hard disk drive.

"Nest" type storage devices further moving the page data relative to each other are configured by the storage device of the embodiment of the present invention constructed by a flash memory (main), a ferroelectric memory (auxiliary), and a hard disk.

One storage device includes three of a ferroelectric memory, a flash memory, and a hard disk drive, the data is moved relative to each other in units of pages between the ferroelectric memory and the flash memory, and the data is moved relative to each other in units of erase blocks between the flash memory and the hard disk.

Many variations may occur along with the formation of the memory hierarchy in this way. The present invention may be applied in any of these cases.

Fifth Embodiment

Figure 18:
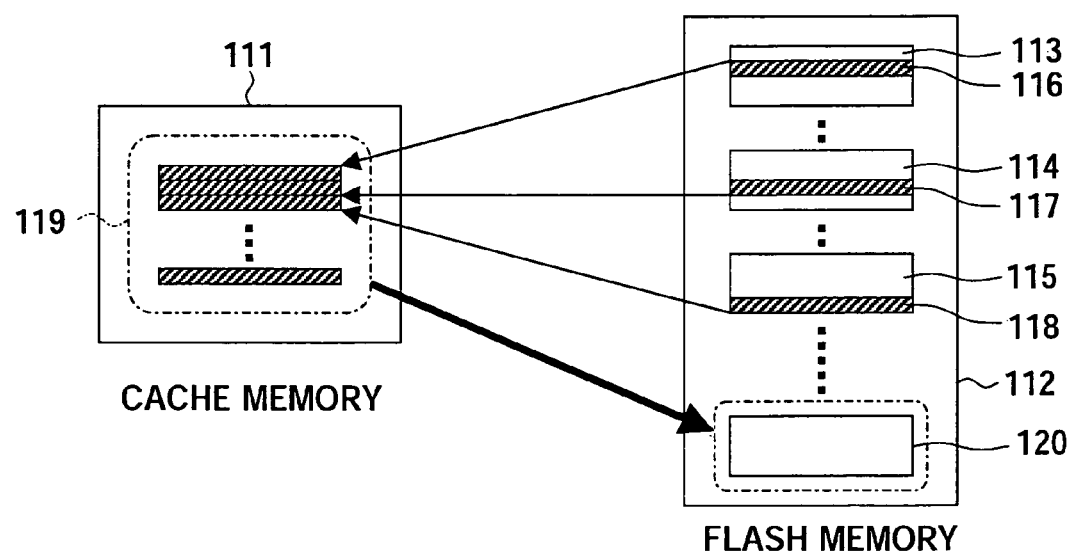
FIG. 18 is a diagram for conceptually explaining a storage device according to a fifth embodiment.

FIG. 18 is a diagram for conceptually explaining a storage device according to a fifth embodiment of the present invention.

In the fifth embodiment, the storage device is provided with a non-volatile cache memory 111. The data read out from the flash memory 112 and updated is moved to that and stored. At that time, the data in the original erase block is invalidated and the unselected data other than that is left as it is. When access to data already moved to the cache memory 111 is requested again, not the flash memory 112, but the cache memory 111 is accessed.

In this way, when the storage device is randomly accessed in units of pages, the page data 116, 117, and 118 are successively read out from a plurality of erase blocks 113, 114, and 115 different from each other and updated and stored in the cashe memory 111. The group of the page data 119 is written back to an already erased empty block 120 in the flash memory 112 all together at the point of time when a specific criteria is reached. Namely, the page data 116, 117, and 118 originally in different erase block are moved to the cache memory 111 and rearranged in the same erase block 120.

In the past, whenever page data in each erase block is updated, all unselected data in the block was read and rewritten. In the fifth embodiment, however, such work appears to be completely unnecessary. The data is written into the flash memory 112 only when the data is written back to an erased spare block in the flash memory 112 so that the cache memory 111 does not become full. As a whole, writing back of one page or less is sufficient with respect to one page's worth of updating.

Figure 19:
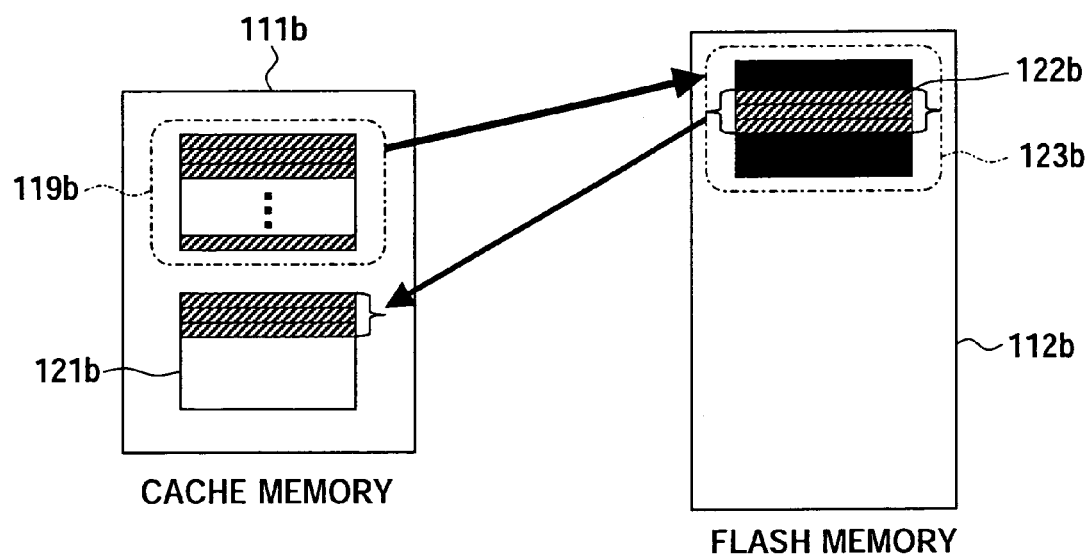
FIG. 19 is a diagram for explaining an example of generation of a spare block according to the fifth embodiment.

When all of the erased blocks in the flash memory 112 are filled by page data, processing such as in for example FIG. 19 may be carried out. Here, assume that it is attempted to write back the group of page data stored in the group of page data 119$b$ to the flash memory 112$b$, but there are no erased empty blocks.

First, many data are updated, moved, and invalidated, and the block having little valid data is selected. For example, where a block 123$b$ is selected in this way, all of valid page data 122$b$ in the block 123$b$ are moved to the empty region 121$b$ in the cache memory 111$b$. Thereafter, by erasing the block 123$b$, the block 123$b$ becomes new already erased block. By this, it becomes possible to move the group of data 119$b$ to the block 123$b$.

Note that to enable such work to be carried out timely according to need, desirably there is always one block's worth of empty region in the cache memory 111$b$. Namely, the cache memory 111$b$ desirably has a capacity able to store at least two blocks' worth of data by combining a data storage region (a storage region 119$b$ of the group of data) and an empty region 121$b$.

Normally the efficiency deteriorates the most with writing into the flash memory when the page data is arranged completely dispersed and data is rewritten uniformly in page units with respect to each block. At this time, in the past, as previously explained, all data in the block had to be moved to the buffer and then written into the flash memory again.

Contrary to this, in the present embodiment, so long as there is an erased empty block, it is not necessary to perform excess writing. However, when there is no longer any empty block, it is necessary to generate an empty block from the blocks having invalid regions for each page. Accordingly, much data is excessively read out and written into the flash memory again.

In such a case as well, employing the fifth embodiment is more advantageous than the past case in the following point.

Namely, the page data arranged dispersed in different blocks in an initial stage shifts to a highly efficient concentrated array by rearrangement of the data in the same block via the cache memory. By this, page data having deep relations are rearranged in the same block, therefore when they are accessed again, much page data will move from the same block to the cache memory. As a result, the block exhibits a state where invalid regions are concentratedly provided, and new empty block can be generated from there with a high efficiency.

Namely, in the storage device of the present embodiment, pages having deep relations change from a dispersed state to a concentrated state as they are accessed. Accordingly, the page arrangement changes with one having a good access efficiency. Accordingly, in any case, the data can be written with a considerably higher efficiency than the past case.

Figure 1:
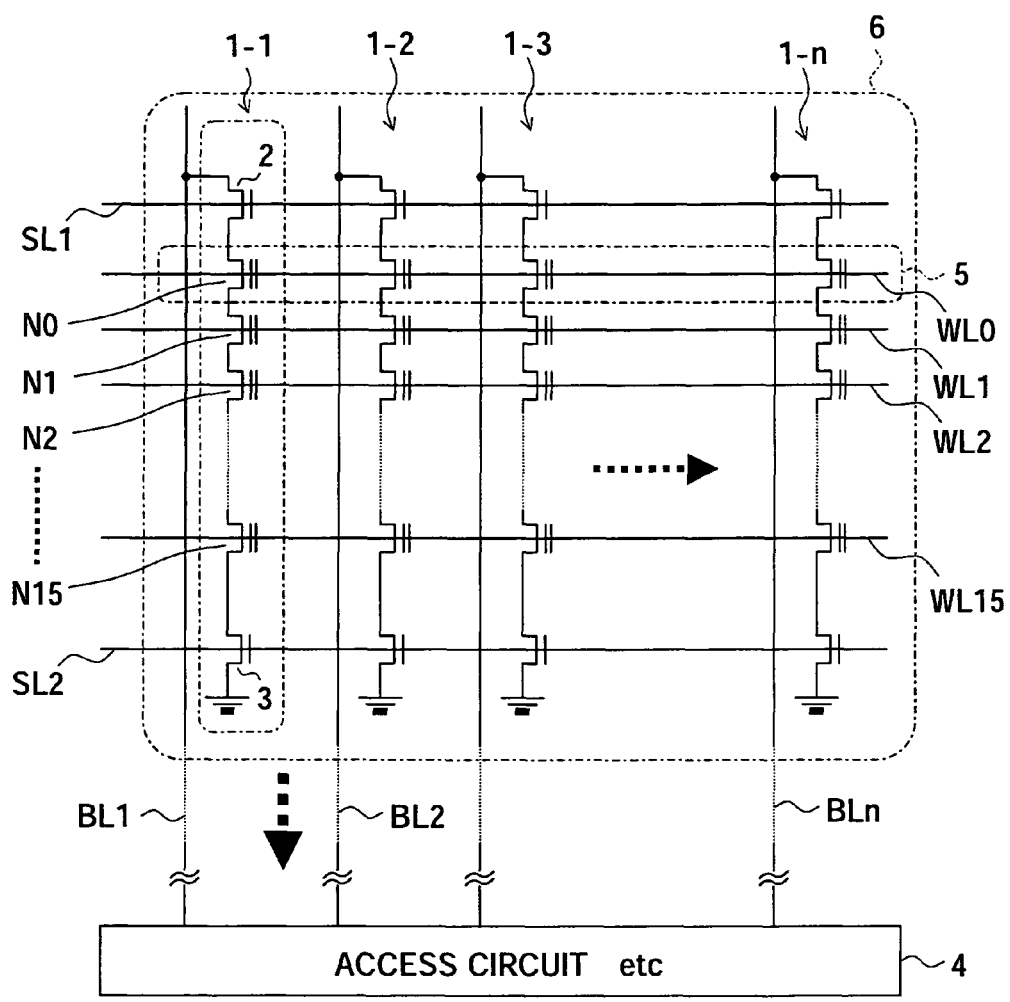
FIG. 1 is a diagram of an example of the internal configuration of a NAND type flash memory.
Figure 2:
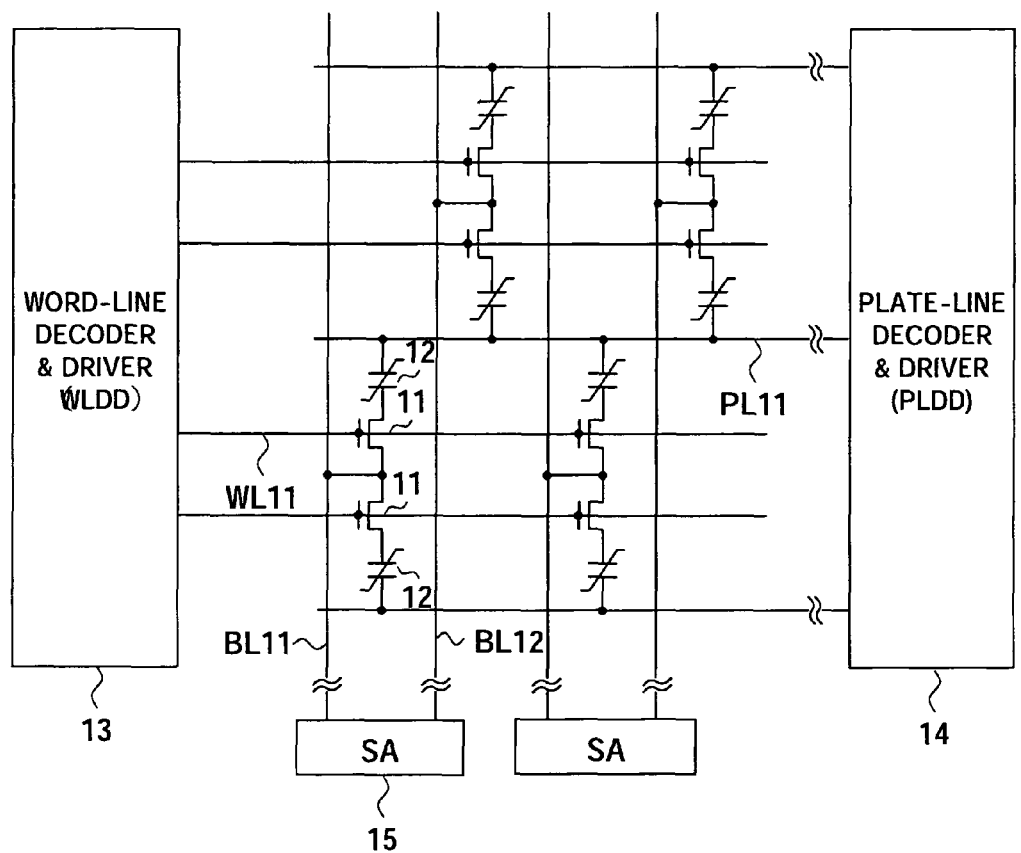
FIG. 2 is a circuit diagram of an example of the configuration of a ferroelectric memory.
Figure 3:
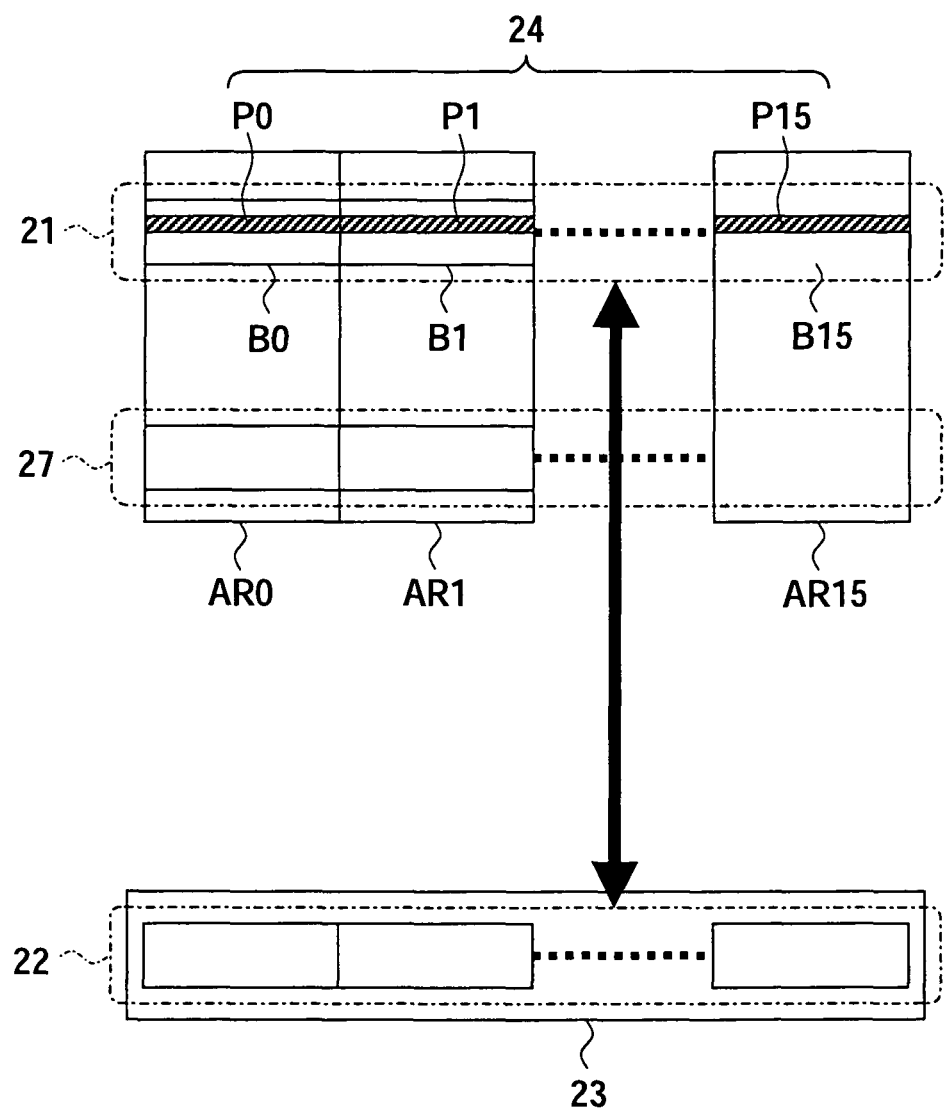
FIG. 3 is a conceptual view of the flash memory configuring the storage device.
Figure 20:
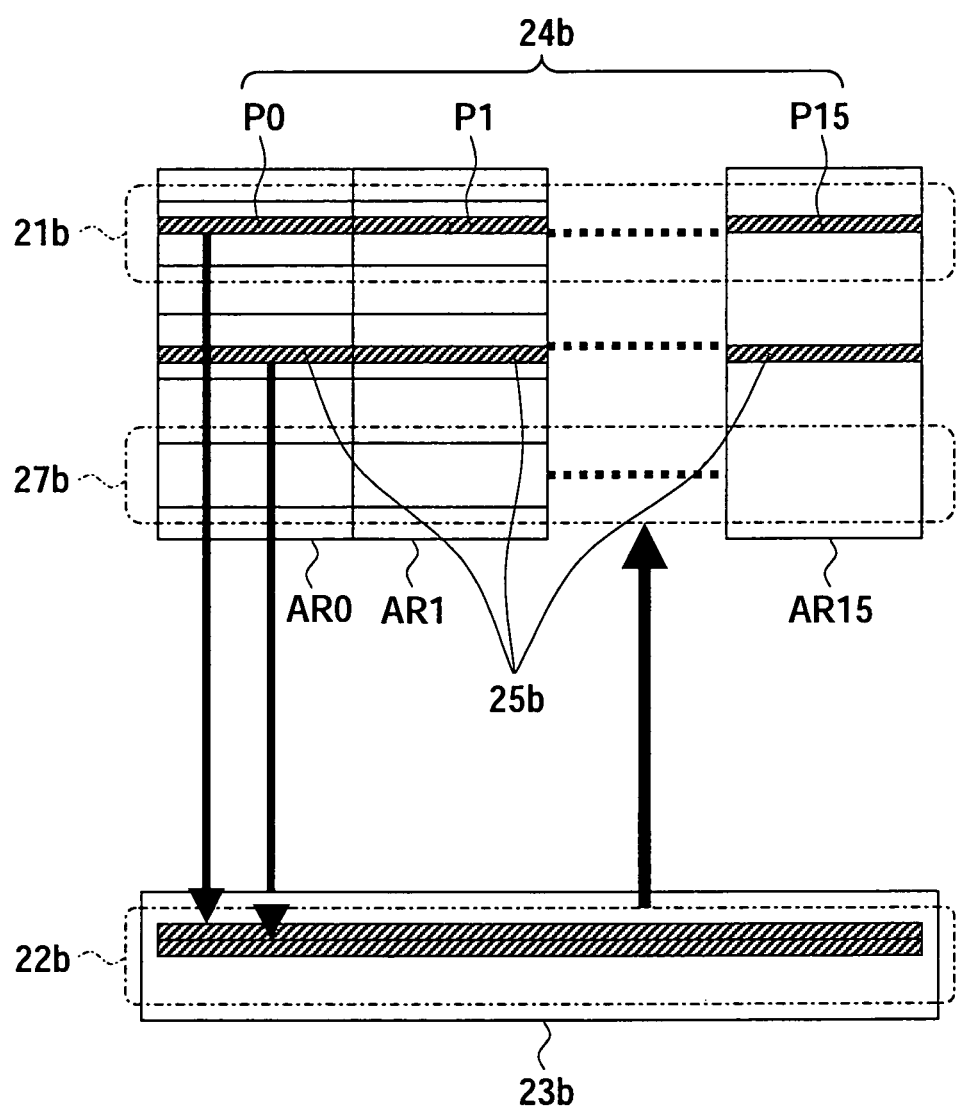
FIG. 20 is a diagram for explaining an example of application to a multi-bank flash memory.

FIG. 20 is a diagram for explaining an example of application the fifth embodiment to a multi-bank type flash memory corresponding to the example of FIG. 3.

As shown in FIG. 20, the flash memory unit is configured by 16 arrays AR0 to AR15. These are simultaneously operated in order to realize high speed transfer. In this case, at the time of writing data, for example a group of pages 24$b$ are simultaneously written as actual page regions. Further, at the time of erasing data, the group of blocks 21$b$ are simultaneously erased as actual erase blocks.

Here, in the present embodiment, when updating a portion of the real page region 24$b$ in the flash memory, only the group of pages 24$b$ are read out and the desired portion is updated and stored in the cache memory 23$b$. Namely, the data of the entire actual erase block (group of blocks) 21$b$ is not read out and not immediately written back to the flash memory side. When a partial region of the group of pages 24$b$ is updated again, the cache region 22$b$ is updated. However, when there is a command for update to another real page region 25$b$, only the data of the group of pages 25$b$ is read out and the desired portion is updated and stored in the cache memory 23$b$.

In this way, the cache memory 23$b$ successively stores the data of actual page regions selected at random, updated, and different from each other. Then, when for example actual page data exceeding a prescribed amount is stored, it is written back to an erased actual erase block 27$b$ all together. Namely, the actual page regions are rearranged via the cache memory 23$b$, and the data of a plurality of pages 24$b$ and 25$b$ read out from the different erase blocks are rearranged in the same erase block 27$b$.

Note that, at this time, the address is converted at the real page region level using the address conversion table so that no mismatch occurs between the address and data seen from the outside. By this, the data of the original page regions 24$b$ and 25$b$ are invalidated, and even when the same page address is accessed from the outside, the pages rearranged in the erase block 27$b$ will be accessed.

Figure 21:
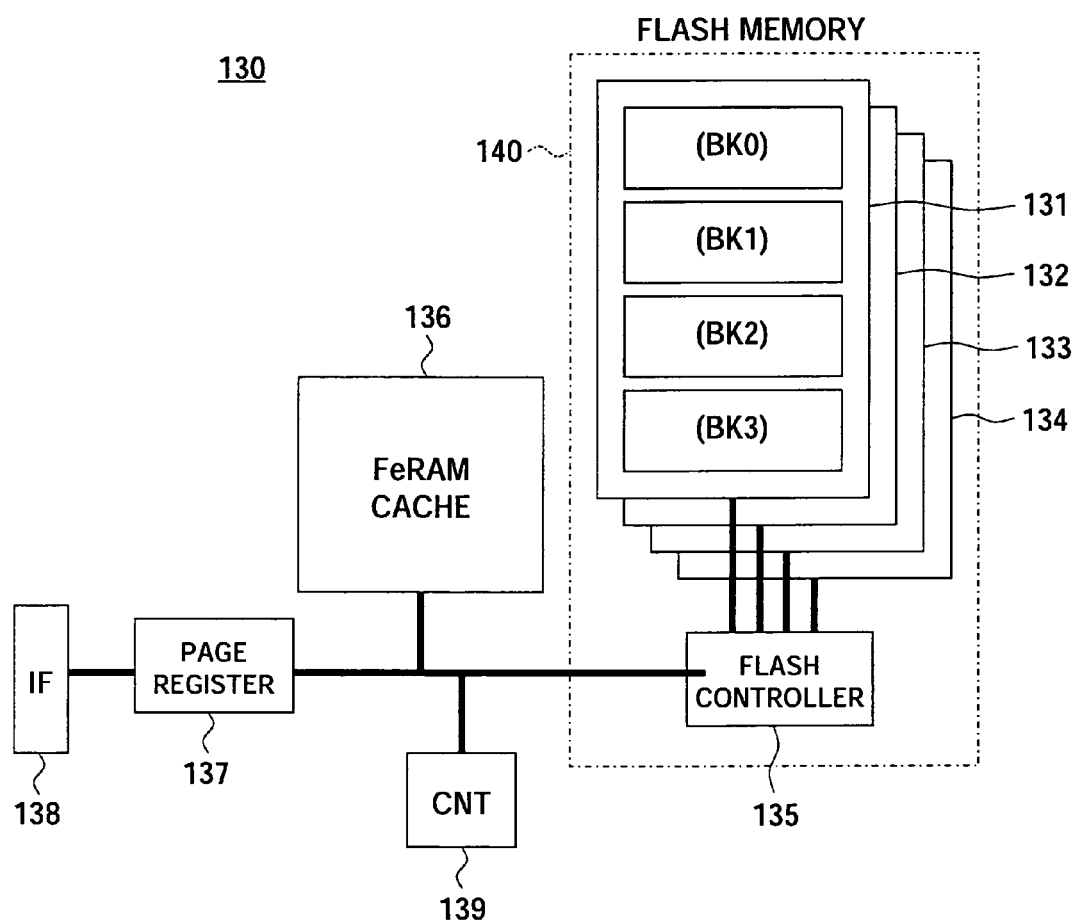
FIG. 21 is a diagram of a further specific example of the configuration of the storage device according to the fifth embodiment.

FIG. 21 is a diagram of a further specific example of the configuration of the storage device according to the present embodiment.

A storage device 130 of FIG. 32 is configured by four 256 MB flash memories 131 to 134 able to perform parallel operation, a flash memory controller 135, a ferroelectric cache memory 136, an input/output use page register 37, an interface (IF) circuit 38, and a control circuit 39.

The flash memories 131 to 134 have four 64 MB memory arrays, for example, banks BK0 to BK3, which can operate in parallel as independent banks. The page size of each of the banks BK0 to BK3 is 2 kB, and the erase block size is 128 kB for the 64 pages together. Namely, the banks BK0 to BK3 have 512 erase blocks. Further, the banks BK0 to BK3 have page storage latches. The write transfer speed of each of the banks BK0 to BK3 is about 10 MB/s.

When writing the data into the banks BK0 to BK3, first, each 2 kB data corresponding to the page size is transferred into the latch and written at the desired page addresses all together after that. The banks BK0 to BK3 can independently designate the page addresses to be accessed, can transfer the data to the latches of the opposite banks during the period where one side banks are written with data, and further can start the writing. Namely, the four banks BK0 to BK3 can operate in parallel. Further, the four flash memories 131 to 134 can operate in parallel, so the entire storage device can access 16 banks in parallel. For example, when dividing one file into 16 banks and writing the data in parallel, substantially writing at a maximum 16× speed is possible.

The flash memory controller 135 is provided with an error correction circuit using ECC encoding and independently performs the address logic/physical conversion in units of blocks with respect to 16 banks in four flash memories 131 to 134 in order to avoid access to a defective block. Namely, the flash memory controller 135 has a table for converting an address to be accessed for each bank, converts an address designated from the outside (logic address) to an internal address (physical address) in a manner bypassing the defective block, and accesses only good blocks.

The four flash memories 131 to 134 configuring the above 16 banks and flash memory controller 135 are integrally formed and can be regarded as a flash memory 140 having no defective blocks and having a page size of (2 kB×16=) 32 kB, an erase block size of (128 kB×16=) 2 MB, and a write transfer speed of (10 MB×16=) 160 MB/s. The memory capacity is a value obtained by subtracting the defective blocks and spare blocks for dealing with subsequently occurring defects from (256 MB×4=) 1 GB.

Inside the storage device 130, the data is transferred between the memories 136, 140 and the page register 137 in units of real pages of 32 kB described above. The control circuit 139 manages the transfer.

When transferring data between the storage device 130 and the outside, the desired page data is transferred once to the page register 137. The IF circuit 138 communicates with the outside via that. An ordinary file is communicated in units of sectors of 512 B, therefore when viewed from outside the storage device, the higher bits of each sector address indicate the logic address of the page data, and the lower bits indicate an address indicating the position of the desired sector in 32 kB in a page.

Figure 22:
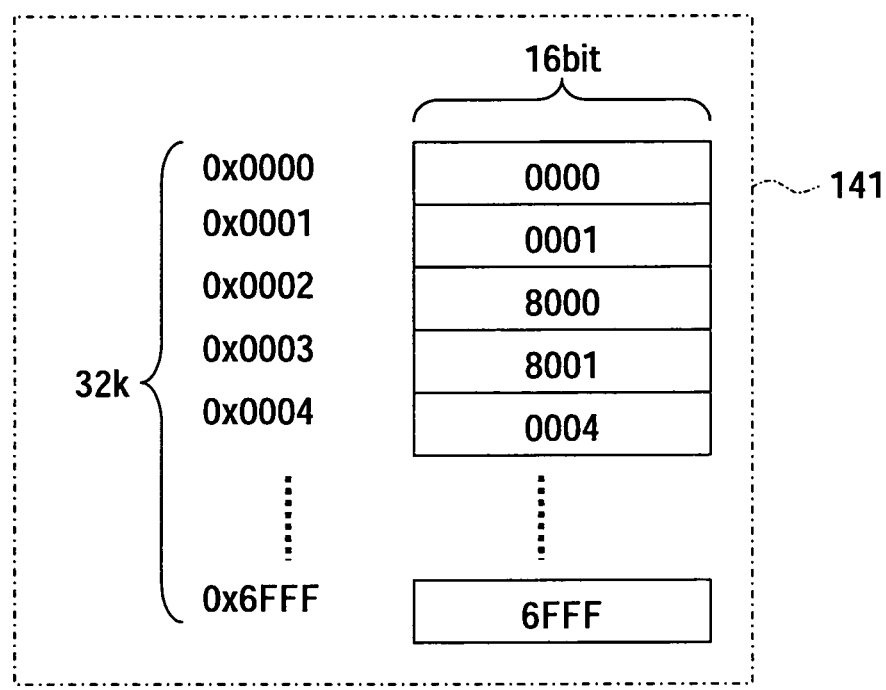
FIG. 22 is a diagram of an example of the internal configuration of a transfer control circuit of page data of FIG. 21.

Inside the transfer control circuit 139 of the page data, as shown in FIG. 22, a table 141 for managing pages is constructed. This table 141 manages at which position in the flash memory 140 or the ferroelectric cache memory 136 each page data is stored corresponding to the logic page address of the device. When the memory capacity is 1 GB, 32 kB pages of 32 kB are stored. Accordingly, the location can be managed in 16 bits of address space, and the memory capacity of the table 141 is about 512 k bit.

Note that, in the present example, in order to supply erased empty blocks abundantly and adequately, spare blocks are provided. Namely, ⅛ of the internal memory capacity is hidden, and the logic address of the page is determined up to 6FFF. In this case, the capacity of the storage device is about 750 MB. For the physical address, a space of 0000 to 7FFF is assigned to the flash memory 140, and a space of 8000 to FFFF is assigned to the ferroelectric cache memory 136 (of course not all of the assigned addresses are used).

When providing such a table, no matter which position the page data is moved to in the flash memory 140 or the ferroelectric cache memory 136, the user can suitably access the desired data by just updating the table. Namely, when the user designates the desired sector address, the logic page address corresponding to the higher bits thereof is accessed on the table, and the location of the corresponding page is specified. The corresponding page is transferred to the page register 137, and the desired bit in the register is accessed on the basis of the lower bits of the sector address.

Further, in the storage device 130, the actual internal memory capacity is larger than the memory capacity in specifications (750 MB). Between them, the address table is interposed. The redundant memory region is used for increasing the efficiency of the access and increasing the speed such as by supplying and abundant and adequate number of erased empty blocks.

Note that it is also possible to mount the transfer control circuit 139 and the flash memory controller 135 on the same chip and control the two by one CPU. In this case, further desirably the I/F unit 138 and the page register 137 are mounted on the same chip. Due to this, the storage device is configured by six chips in total, that is, the above complex control chip, the FeRAM chip, and four flash memory chips.

Below, an explanation will be given of an example of the internal transfer control at the time of access to the storage device 130.

A. Reading of Cluster

1. Assume that in order for a user to read a cluster of 4 kB, he inputs the address of the header sector thereof and the command. In a 750 MB storage device, the address of a 512 B unit sector can be designated by 21 bits. At that time, the higher 15 bits become the page address, and the lower significant 6 bits become the sector address in the page.

2. First, the table 141 is accessed and referred to from the page address. As a result, the location of the page is decided, and the corresponding page data is transferred from either of the flash memory 140 or the ferroelectric cache memory 136 to the page register 137.

3. Next, the corresponding sector data in the page register 137 is selected and output on the basis of the address of the lower 6 bits.

4. Note that all the following continuous sectors configuring the cluster are present in the page register 137, therefore the reading is carried out from there from then.

B. Writing of Cluster

1. Assume that in order for a user to write a cluster of 4 kB, he inputs the address of the header sector thereof and the command. In the same way as the time of reading, the higher 15 bits among the 21 bits addresses become the page address, and the lower significant 6 bits become the sector address in the page.

2. First, the table 141 is accessed and referred to from the page address. As a result, the location of the page is decided, and the corresponding page data is transferred from either of the flash memory 140 or the ferroelectric cache memory 136 to the page register 137.

3. Next, the corresponding sector data in the page register 137 is selected and updated on the basis of the address of the lower 6 bits.

4. Note that, all of the following continuous sectors configuring the cluster are present in the page register 140, therefore the data of the page register 137 is subsequently updated.

5. If the updated page data is present in the ferroelectric cache memory 136, it is overwritten at the original position. On the other hand, if the updated page data is present in the flash memory 140, it is written into the empty region of the ferroelectric cache memory 36, and the table 141 is updated. Namely, the updated page data moves from the flash memory 140 to the ferroelectric cache memory 136, and the original page region in the flash memory 140 becomes invalid.

6. Thereafter, for writing the other clusters, the operation of 1 to 5 is repeated. Due this, the updated page data is stored in the ferroelectric cache memory 136.

7. When 64 pages, that is, 1 block's worth, of the data is stored in the ferroelectric cache memory 136, the page data is successively written into the erased empty blocks in the flash memory 140. Simultaneously, the table 141 is updated, and the page data moves from the ferroelectric cache memory 136 to the flash memory 140.

Note that there are many possible variations in the routine for writing back the page data from the ferroelectric cache memory 136 to the flash memory 140. This may be continuously carried out for the amount of 1 block at a stretch as well, but access to the storage device is prohibited during that time. Accordingly, the access to the storage device 130 and the writing back of the inside may be scheduled in a time division manner, and the data may be written back for each page whenever for example one page's worth of the access is performed from the outside.

Further, when writing the page data into the ferroelectric cache memory 136, if providing the spare region for each page and leaving a time stamp or other record indicating the sequence of updating the pages, the efficiency of the access can be further improved. In this case, at the time of writing back data to the flash memory 140, the data may be written in sequence from the oldest updated data. Due to this, the hit ratio to the cache at the time of writing rises, and the number of times of actual writing to the flash memory can be decreased.

In the present embodiment, a ferroelectric memory was used for the cache memory 136. Even when not using a non-volatile memory for this portion, but for example using an SRAM or DRAM, it is possible to temporarily store the page data by the same processing. However, a non-volatile memory is desirably employed for the following reason.

When this memory is a volatile memory, it is in the end only a temporary storage. Accordingly, even when page data is moved there and the data in the flash memory before that is invalidated, it is dangerous to place the data in a state where it cannot be restored at all. Accordingly, it is necessary to leave the original address as backup in the table, so the management thereof becomes very complex.

When the power is turned off, the page data in the volatile memory vanishes, therefore the internal valid data must be written back into the flash memory without fail before that. Accordingly, a long time is taken before the power is actually turned off. Also, the processing is troublesome. Further, due to this, an incomplete block in which the data has been erased and only a portion of data is written is easily generated.

When the battery of the mobile device runs down, lightning causes the power to be cut off to a desktop device, or the power is cut off due to another unexpected factor, not only is the updated data lost, but also a mismatch occurs between data.

Further, it is necessary to also store the address table 141 when the power is turned off. For this, for example the following technique is effective.

The spare region is provided when storing page data in various memories, and the logic address thereof is stored together for each page. Due to this, by scanning the pages in the memory by this, the table can be reconstructed every time. The table per se is constructed in the ferroelectric memory 140 or the table is stored in the ferroelectric memory when the power is off.

Note that, as the non-volatile cache memory, use can be made of a memory using a ferromagnetic material, phase transition material, or magnetoresistance effect material as explained before other than a ferroelectric memory. Further, for the main medium, a flash memory is representative at the present point of time, but the present invention can be applied so long as it is a non-volatile memory requiring erasing for rewriting and having a larger erase unit than the ordinary access unit.

Sixth Embodiment

Figure 23:
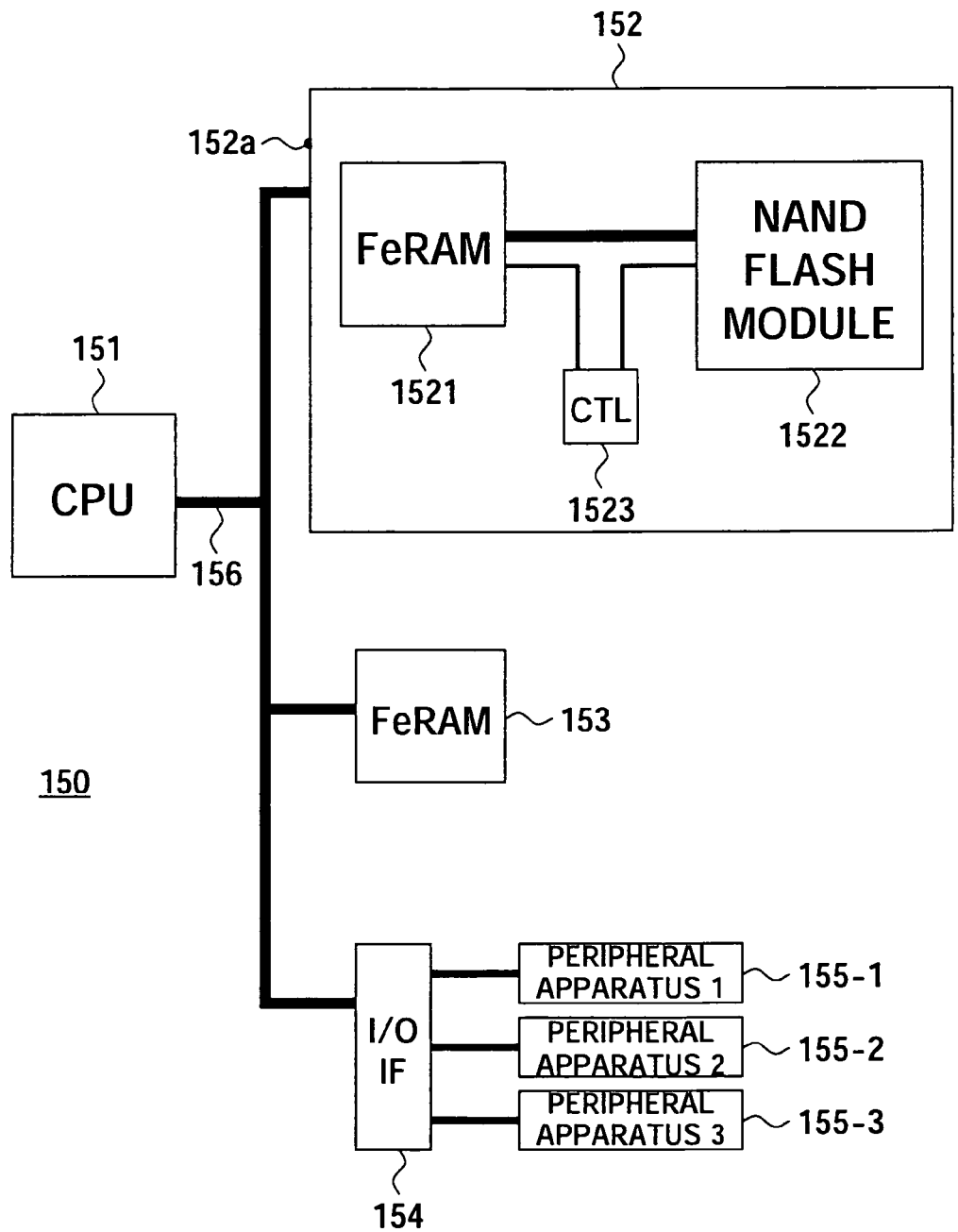
FIG. 23 is a block diagram of an information processing system (computer system) according to a sixth embodiment.

FIG. 23 is a block diagram of an information processing system (computer system) according to the sixth embodiment.

An information processing system 150 of the present embodiment has a host controller (CPU) 151, a semiconductor storage device 152, a ferroelectric memory (FeRAM) 153, a group of interface circuits (I/O IF) 154, peripheral apparatuses 155-1, 155-2, and 155-3, and a system bus 156 as principal components.

In the system 150 of FIG. 23, a semiconductor storage device 152 according to the embodiment of the present invention is connected to the CPU 151 via the system bus 156. The semiconductor storage device 152 is mounted as an ordinary random access memory added with a status notification pin 152a. It is also possible to make it compatible in pins with a NOR type flash and mount it as is on the ordinary board.

The semiconductor storage device 152 of the present embodiment is configured including for example a 32 Mb ferroelectric memory 1521 as a high speed first memory, a NAND type flash memory module 1522 of 1 GB as a low speed second memory, and a control circuit (CTL) 1523 in the same package.

In the flash memory module 1522, the internal memory is divided into 16 banks. By operating them in parallel, high speed transfer of the block data is possible. Other than that, the module includes a function circuit converting the logic addresses in units of blocks of the internal flash memory to the physical addresses and prohibiting access to an error block and a function circuit applying encoding error correction to the data read out by the ECC circuit.

The control circuit 1523, as will be explained later, executes and controls the data transfer between the ferroelectric memory 1521 and the NAND type flash memory module 1522 inside the semiconductor storage device 152.

Figure 4:
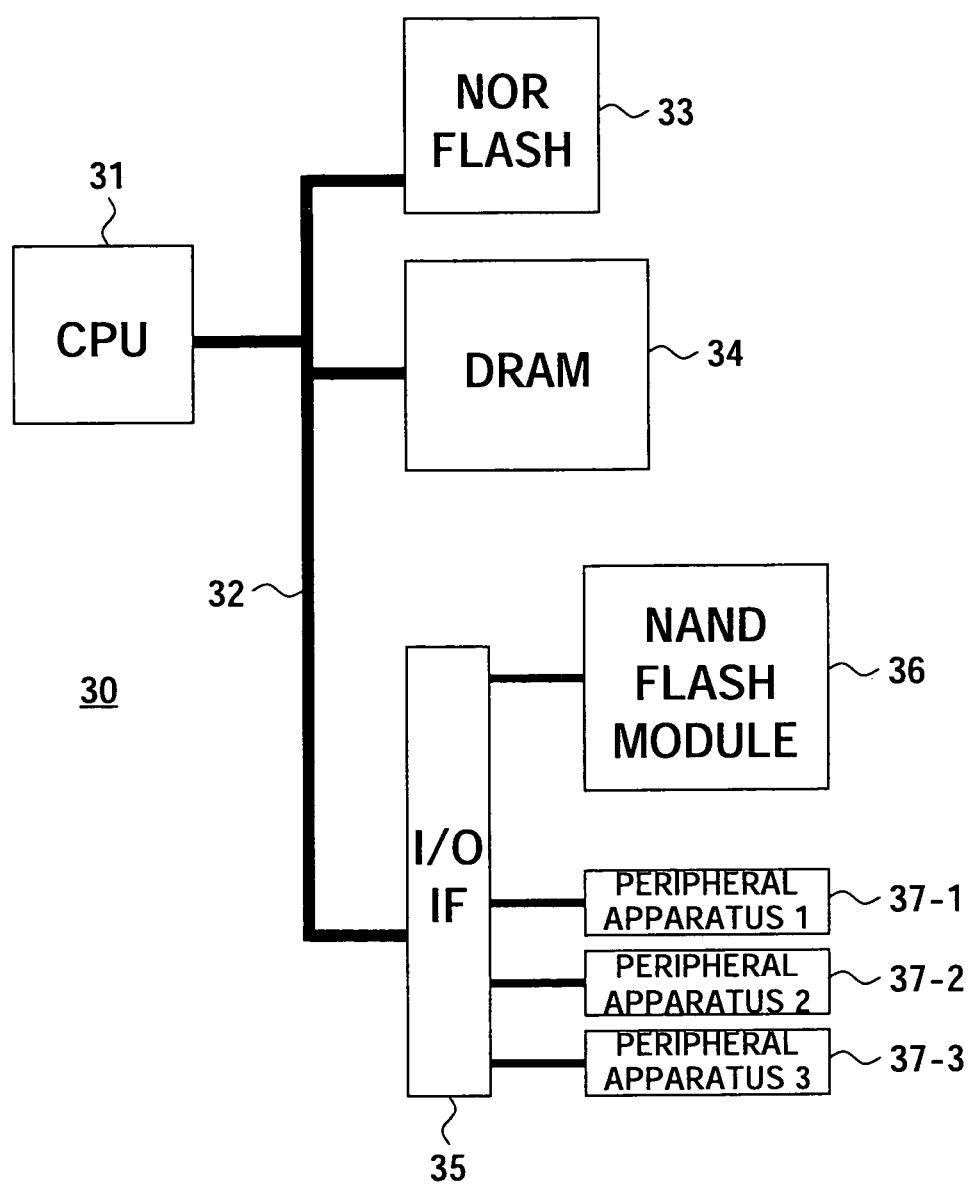
FIG. 4 is a block diagram of an example of the configuration of an information processing system (computer system) selectively using various types of memories for each application.
Figure 5:
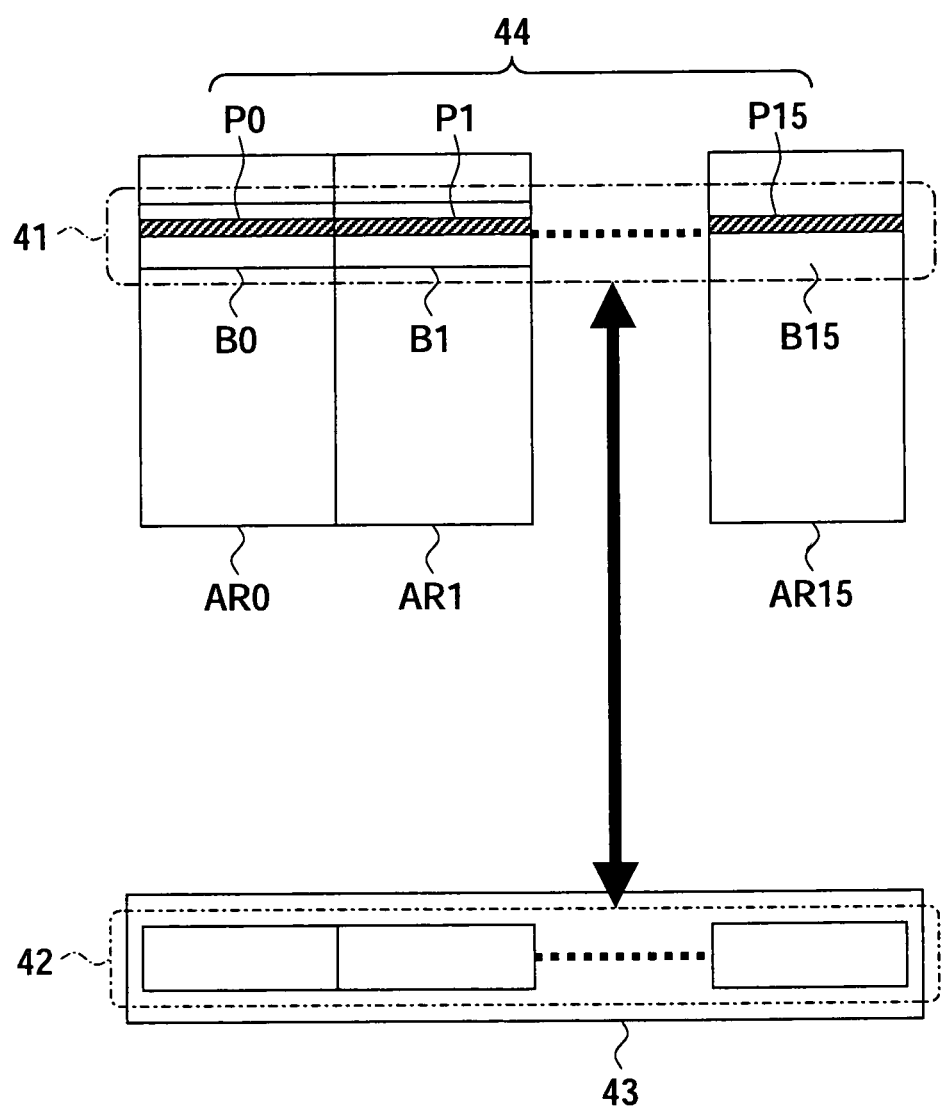
FIG. 5 is a diagram conceptually showing a rewrite operation of the NAND type flash memory.

The semiconductor storage device 152 combines the functions of for example the NOR type flash 33, DRAM 34, and NAND type flash module 36 in FIG. 4 and stores most of the operating system kernel, application program, work area, and user data. The addresses thereof are mapped in the system memory and treated as a non-volatile large capacity random access memory.

Further, in the present system 150, the system bus 156 is connected to a relatively small capacity ferroelectric memory 153 and connected to various types of peripheral apparatuses 155-1 to 155-3 via the interface circuit group 154.

The memory access routine of the host controller 151 in the present system 150 is as follows.

When the host controller 151 accesses the semiconductor storage device 152, if there is the desired data or a copy in the ferroelectric memory 1521, the control circuit 1523 of the semiconductor storage device 152 accesses it. Accordingly, this can be used as an ordinary random access memory from the outside. If the desired data or a copy thereof is not present there, the control circuit 1523 sends a busy signal to the notification pin 152a and transfers the required data from the flash memory module 1522 to the ferroelectric memory 1521.

The host controller 151 generates an interruption when receiving the busy signal and executes the code of the interruption handler described in the separately provided ferroelectric memory 153. By this, the memory access is interrupted, and the host controller 151 enters into a stand-by state while monitoring the status of the notification pin 152a. When the transfer processing in the semiconductor storage device 152 ends, the notification pin 152a enters a ready state, and the memory access is restarted.

Namely, the semiconductor storage device 152 can usually be used as a random access memory without a problem, but requests the interruption and standby if the desired data does not exist in the ferroelectric memory 1521. For that processing, the memory regions for the interruption vector, stack, interruption handler, etc. which become necessary at least are stored in the separately provided small capacity ferroelectric memory 153. The total capacity is usually several tens of kB. Here, they were stored in the small capacity ferroelectric memory, but use may be made of a mask ROM or EPROM for the code storage and an SRAM etc. for the stack as well. They may be built in the IF circuit chip of the host controller (CPU) 151 or the interface circuit group 154 as well.

Alternatively, it is also possible to integrally form the small capacity ferroelectric memory 153 in the same package together with the semiconductor storage device 152.

Figure 24:
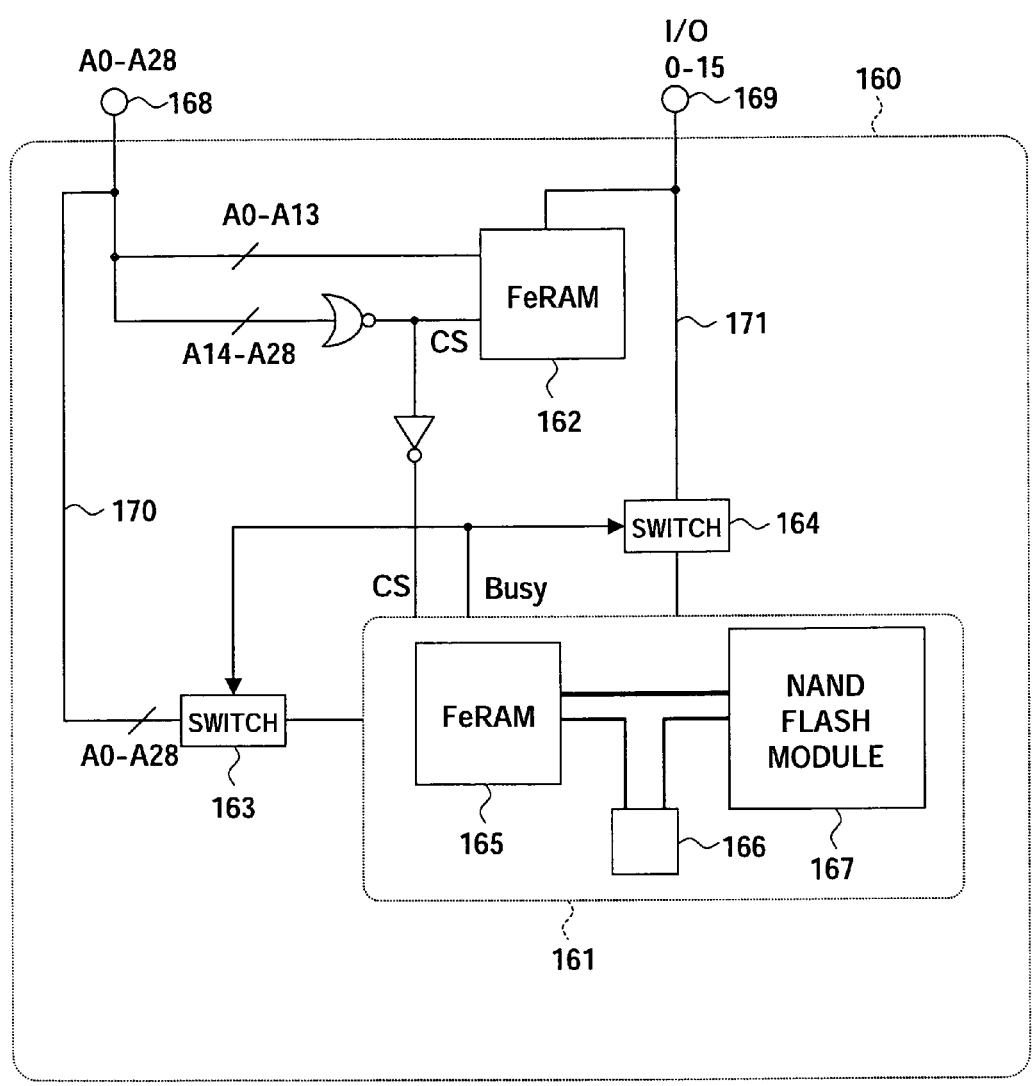
FIG. 24 is a diagram of an example of a configuration integrally forming a small capacity ferroelectric memory and a semiconductor storage device in the same package.

FIG. 24 is a diagram of an example of the configuration in which the small capacity ferroelectric memory 153 is integrally formed in the same package together with the semiconductor storage device 152. In FIG. 24, the storage device 160 has a large capacity memory unit 161, a small capacity ferroelectric memory 162, switches 163 and 164, a ferroelectric memory 165, a transfer control circuit 166, a NAND type flash memory 167, external terminals 168 and 169, a common address line 170, and a common bus (BUS) 171.

In FIG. 24, the storage device 160 includes a large capacity memory unit 161 corresponding to 151 of FIG. 23. This memory unit 161 includes the ferroelectric memory 165, the control circuit 166, and the NAND type flash module 167. Further, the storage device 160 includes the small capacity ferroelectric memory 162 for storing the interruption handler and stack. In the storage device 160, address regions of the higher 256 kb (32 kB) from the address 0 are mapped in the small capacity ferroelectric memory 162, and the following regions are mapped in the large capacity memory region 161. Namely, when assuming that the storage device 160 has a capacity of 1 GB, when all of the addresses A14 to A28 are 0, the ferroelectric memory 162 is accessed. The memory unit 161 is accessed in other cases.

Here, an address terminal and an IO terminal of the memory unit 161 are timely disconnected from external terminals 168 and 169, a common address line 170 connected to the small capacity ferroelectric memory 162, and a common bus 171 by switches 163 and 164. Namely, in the memory unit 161, while the data is being transferred between the ferroelectric memory 165 and the NAND type flash module 167 and the busy signal is transmitted, the bus and address lines in the memory unit 161 are used for the internal transfer under the control of the internal transfer control circuit 166, therefore are disconnected from the common address line and bus. Due to this, the interruption vector in the small capacity ferroelectric memory 162 can be accessed from the outside without a problem while executing the desired transfer in the memory unit 161.

When employing such a configuration, the user can replace all of memories by just the storage device 160. Further, in this case, the small capacity ferroelectric memory 162 can be formed on the same chip as the ferroelectric memory 165 of the memory unit 161 in the same process, therefore it is possible to mount this with almost no cost increase.

Figure 25:
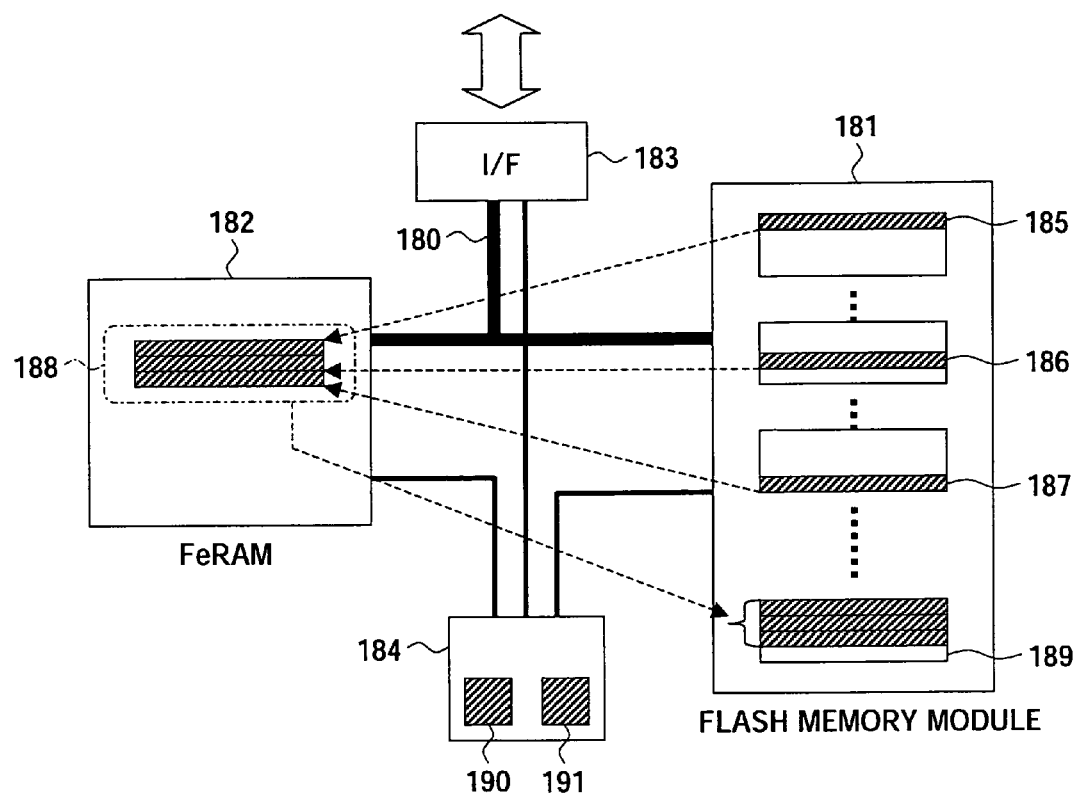
FIG. 25 is a diagram more specifically showing an example of the internal configuration of the semiconductor storage device of the present embodiment.
Figures 26A, 26B:
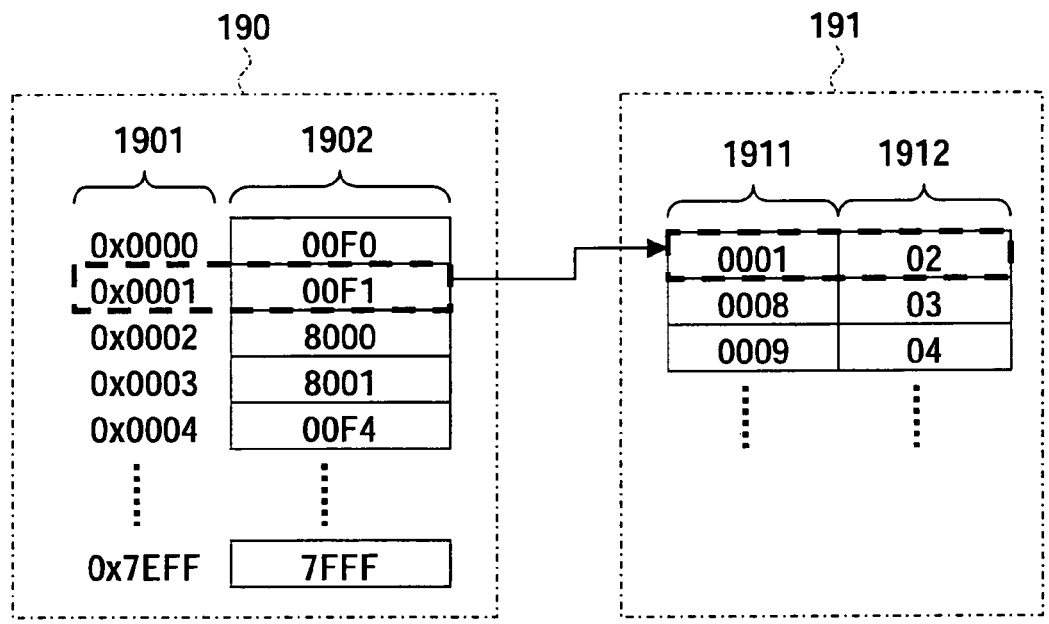
FIGS. 26A and 26B are diagrams of an example of an address conversion table and a cache table in the transfer control circuit of FIG. 25.

FIG. 25 is a diagram specifically showing an example of the internal configuration of the semiconductor storage device of the present sixth embodiment. FIGS. 26A and 26B are diagrams showing an example of the address conversion table and the cache table in the transfer control circuit of FIG. 25.

In FIG. 25, 180 indicates the internal bus, 181 indicates the main memory, 182 indicates the auxiliary memory, 183 indicates the input/output interface circuit, 184 indicates the transfer control circuit, 185 to 187 indicate pages, 188 indicates a group of pages, 189 indicates the already erased empty block, 190 indicates the address conversion table, and 191 indicates the cache table. Further, in FIG. 26A, 1901 indicates the logic address, and 1902 indicates the physical address, and in FIG. 26B, 1911 indicates the entry, and 1912 indicates the page address.

Below, an explanation will be given of the method for judgment of the presence of data in the ferroelectric memory and the routine for movement of data between the flash memory module and the ferroelectric memory with reference to FIG. 25 and FIGS. 26A and 26B.

The input/output interface circuit 183 with the outside is connected with the large capacity main memory 181 configured by the NAND type flash memory module and the auxiliary memory 182 configured by the ferroelectric memory via the internal bus 180 and further to the transfer control circuit 184. The main memory 181 has 16 banks arranged inside it in parallel at a high level. A 32 kB group of data is simultaneously accessed as a unit page and serially input/output and transferred to the internal bus 180. Further, inside the device, an address conversion table 190 is constructed using the page described above as a management unit. This is constructed in for example the SRAM built in the transfer control circuit 184. Further, the cache table 191 is constructed in the transfer control circuit 184 and is stored in for example a built-in associative memory.

The transfer control circuit 184 compares the logic address input from the outside to the address conversion table 190 and the cache table 191, accesses the data of the auxiliary memory 182 at random according to the results thereof, or performs two-way transfer of data in unit of pages between the main memory 181 and the auxiliary memory 182 according to need.

When the address of the desired data to be accessed is designated from the outside, the transfer control circuit 184 extracts the corresponding logic page address from the higher bit thereof and refers to the address conversion table 190.

The address conversion table 190 is comprised of the correspondence between logic addresses 1901 and physical addresses 1902 and enables access to addresses on the RAM storing the table so as to obtain the corresponding physical address. In the physical address space, regions 0x0000 to 0x7FFF indicate page addresses in the main memory 181. On the other hand, 0x8000 or more regions indicate the auxiliary memory 182. For example, the physical address 0x8001 indicates that the desired page is present at the address 0x0001 of the auxiliary memory 182.

The transfer control circuit 184 judges the location of the desired page by using the address conversion table 190 and judges whether or not the data is stored in the auxiliary memory 182 first. If the data is not stored, the cache table 191 is referred to this time, and it is judged whether or not the copy of the desired data is stored in the auxiliary memory 182 this time.

The cache table 191 uses the logic addresses as TAGs to store the correspondence of the page addresses 1912 on the auxiliary memory 182 corresponding to the entries 1911. For example, in the example of the figure, when an access request to the logic page address 0x0001 occurs, it is seen that the corresponding physical address in the address conversion table 190 is 0x00F1. The main portion of the data is present in the main memory 181. In this case, in the cache table 191 this time, the entry of the TAG matching with the logic address 0x0001 is retrieved. Here, it is clarified that the copy of the page including the desired data is stored at the address 0x0002 of the ferroelectric auxiliary memory 182.

These judgments are desirably carried out as much as possible at a high speed so as not to obstruct the access speed when viewing the semiconductor storage device 152 from the outside. Accordingly, for example, use is made of an SRAM for the address conversion table 190 and an associative memory for the cache table 191. If necessary, references of the address conversion table 190 and the cache table 191 may be simultaneously executed in parallel as well. By this, so long as the data or a copy thereof is present in the auxiliary memory 182, the present storage device can be treated in exactly the same way as an ordinary random access memory.

The remarkable feature in the semiconductor storage device explained above is that the ferroelectric auxiliary memory 182 used as the high speed memory not only includes a copy of the data in the main memory 181, but also the data itself. The management thereof is carried out by the address conversion table 190.

For example, for the data at the logic address 0x0001, assume that the address conversion table 190 is updated, the corresponding physical address is rewritten to 0x8002 corresponding to the storage portion of the copy thereof on the ferroelectric auxiliary memory 182, and the entry on the cache table 191 is deleted. Due to this, the page data at 0x00F1 on the main memory 181 on the copying side is invalidated, and the side of the copy data starts to be accessed after that. Namely, it becomes the data itself. Namely, this means that the data itself moves from the main memory 181 to the auxiliary memory 182.

It is no longer necessary to reflect the result of any updating of the data once moved to the auxiliary memory 182 to the main memory 181 side. Accordingly, particularly in the case of write access, by moving the data, the writing back which was indispensable for an ordinary cache becomes unnecessary, and the overhead accompanied that can be greatly reduced.

Further, assume that pages 185 to 187 read out from erase blocks different from each other are updated one after another in this way and move to the auxiliary memory 182. When there is no longer any empty region in the auxiliary memory 182, the transfer control circuit 184 has to move these pages to the main memory 181 again. The movement at this time can be carried out to any erased region on the main memory unlike the writing back from an ordinary cache memory. For example, data may be moved to an erased empty block 189 all together. It is not necessary to perform rewriting etc. such as block erasing of the reading side and the data evacuation of the entire block for each page as in the usual case. Namely, only the group of pages 188 need be successively transferred from the auxiliary memory 182 to the block 189 of the main memory 181. The address conversion table 190 may be rewritten in accordance with that.

It is also possible to use a volatile memory for the auxiliary memory 182 in the present embodiment, but loss of the data is not permitted. Accordingly, it is necessary to provide a specific region in for example the main memory 181 and evacuate the content to that when the power is turned off. Further, the evacuated data must be restored when the power is turned on, an excessive time is taken for activation and ending, and in addition there is susceptibility to momentary cutoff of power. Accordingly, the auxiliary memory 182 is desirably a non-volatile memory performing higher performance access than the flash memory. Specifically, a memory using a ferroelectric material, phase change material, ferromagnetic material, or magnetoresistance effect material is desirable.

Further, loss is not permitted in the address conversion table 190 either. For example, if the logic address of each page is stored in the spare region for each page, reconstruction is possible, but a long time is required for scanning all pages in the storage device. Accordingly, the data of the address conversion table 190 is desirably backed up in the non-volatile auxiliary memory 182.

Further, the data moved to the auxiliary memory 182 has to be moved to the main memory 181 side again when there is no longer any empty region at the auxiliary memory side. On the other hand, the data copied to the auxiliary memory 182 need only be discarded if it has not been updated. Accordingly, in order to suppress writing to the main memory (particularly the flash memory), which becomes a bottleneck, to the lowest limit, desirably movement and copying are selectively used as follows.

Namely, when it is necessary to transfer data at the time of reading data, in the same way as an ordinary cache, a copy is transferred from the main memory to the auxiliary memory and the original data is left. On the other hand, when it is necessary to transfer data at the time of writing data, the data itself is moved. Further, even when a copy is transferred for reading data, if the data is rewritten later, writing back becomes necessary. In this case, the substance is moved to make writing back unnecessary. This operation can be executed by just rewriting the address conversion table and deleting the cache entry as explained before.

Next, an explanation will be given of the routine for data operation in the semiconductor storage device in the case of the read and write access in the present embodiment.

Figure 27:
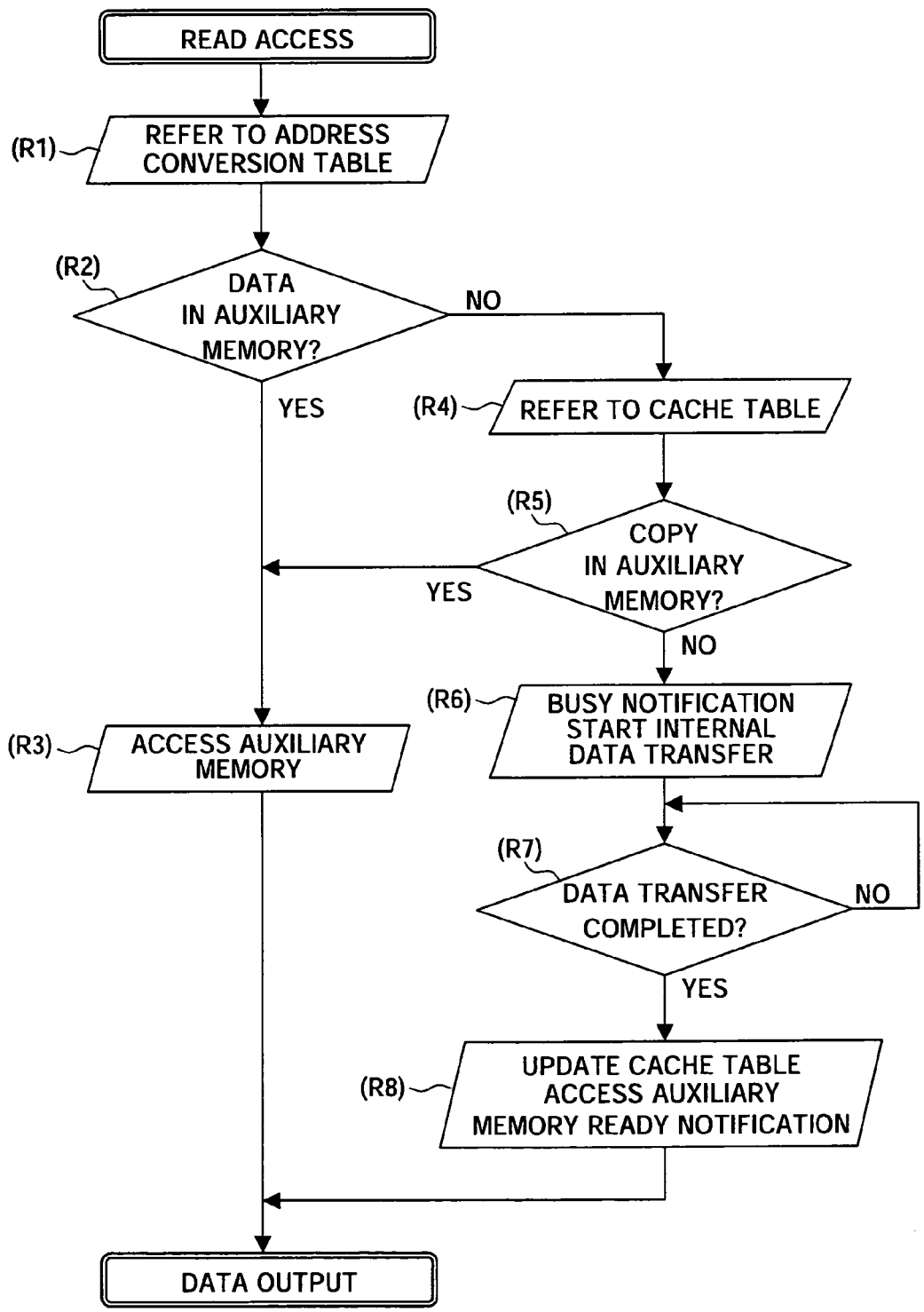
FIG. 27 is a flow chart for explaining a data operation in the semiconductor storage device in the case of a read access.

First, an explanation will be given of the case of the read access. FIG. 27 is a flow chart for explaining the data operation in a semiconductor storage device in the case of the read access.

(R1): When the access command and address are input from the outside, the address conversion table 190 is referred to based on the higher bits corresponding to the page address.

(R2): It is judged whether or not the data is present in the auxiliary memory 182.

(R3): When the converted address is designated on the auxiliary memory 182, the auxiliary memory 182 is accessed from this address after conversion and the lower bits.

(R4): When the converted address is designated on the main memory 181, the cache table is referred to this time, and the TAG is retrieved.

(R5): It is judged whether or not a copy is present in the auxiliary memory 182.

(R3): When the cache is hit and the address of the copy page on the auxiliary memory 182 is acquired, the auxiliary memory 182 is accessed from this address and the lower bits.

(R6): When the cache is missed, the notification pin becomes busy in state, external access is prohibited, and the page data is transferred from the main memory 181 to the auxiliary memory 182. If there is insufficient empty region in the auxiliary memory 182, an existing copy page in the auxiliary memory 182 is discarded or existing data in the auxiliary memory 182 is moved and transferred to the main memory 181.

(R7): It is judged whether or not the data transfer is completed.

(R8): When the data transfer is completed, the cache table 191 is updated and a new TAG entry is added. Thereafter, the auxiliary memory 182 is accessed, and the notification pin changes to the ready state.

Figure 28:
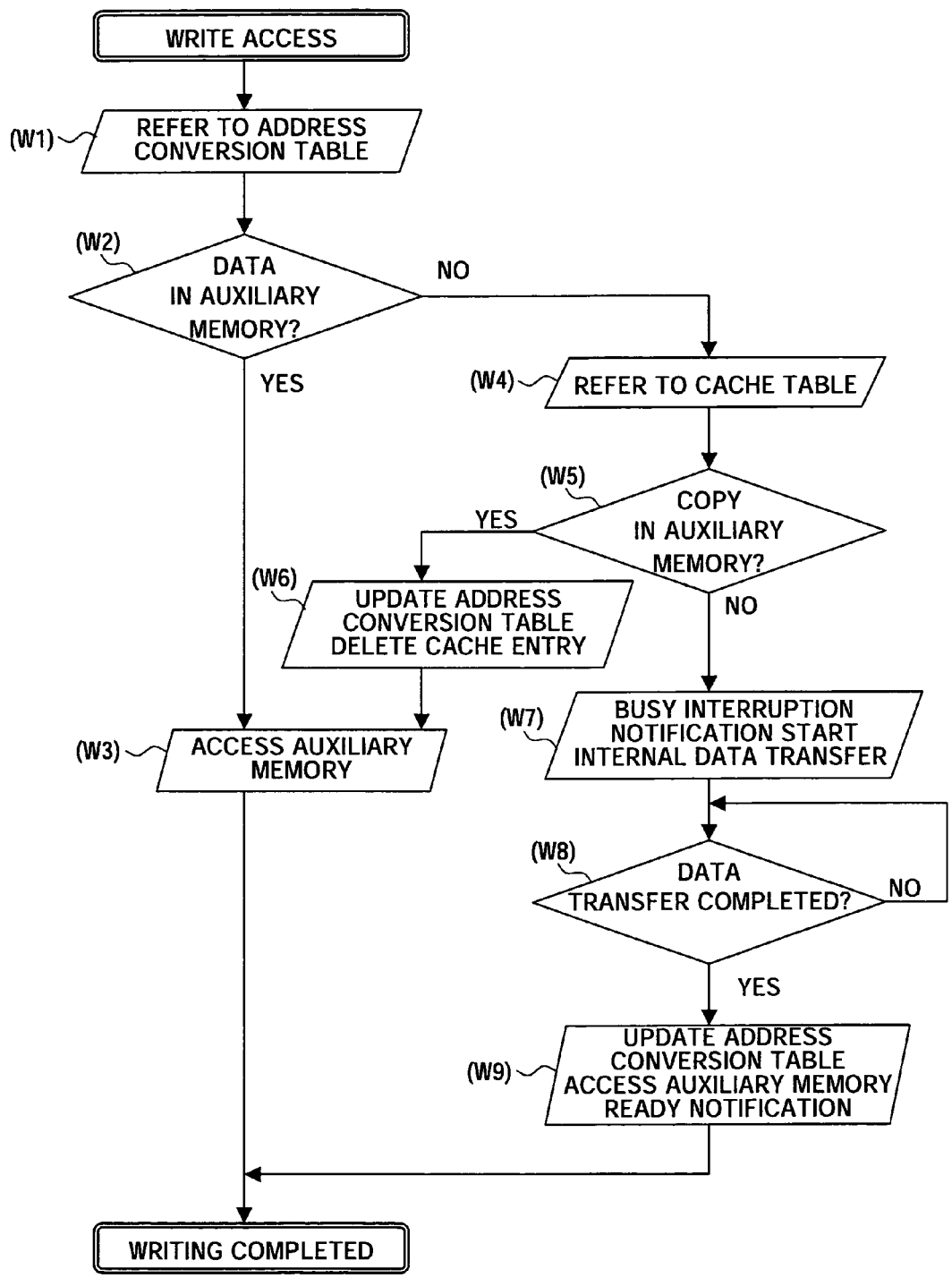
FIG. 28 is a flow chart for explaining a data operation in the semiconductor storage device in the case of a write access.

Next, an explanation will be given of the case of the write access. FIG. 28 is a flow chart for explaining the data operation in the semiconductor storage device in the case of the write access.

(W1): When an access command and address are input from the outside, the address conversion table 190 is referred to based on the higher bits corresponding to the page address.

(W2): It is judged whether or not the data is present in the auxiliary memory 182.

(W3): When the converted address is designated on the auxiliary memory 182, the auxiliary memory 182 is accessed from this address after conversion and the lower bits and then the desired data is updated.

(W4): When the converted address is designated on the main memory 181, the cache table 191 is referred and the TAG is retrieved.

(W5): It is judged whether or not a copy is present in the auxiliary memory 182.

(W6): When the cache is hit and the address of the copy page on the auxiliary memory 182 is acquired, the address conversion table 190 is updated, and the physical address with respect to the predetermined logic page address is changed to an address on the auxiliary memory 182. Further, the entry of the cache is deleted. The movement of the data is carried out by this, and the copy page on the auxiliary memory 182 becomes the main data.

(W3) Further, the auxiliary memory is accessed from the above address and the lower bits, and the desired data is updated.

(W7): When the cache is missed, the notification pin becomes busy in state, external access is prohibited, and page data is transferred from the main memory 181 to the auxiliary memory 182. If there is insufficient empty region in the auxiliary memory 182, an existing copy page in the auxiliary memory 182 is discarded or existing data in the auxiliary memory 182 is moved and transferred to the main memory 181.

(W8): It is judged whether or not the data transfer is completed.

(W9): When the data transfer is completed, the address conversion table 190 is updated, and the physical address with respect to the predetermined logic page address is changed to the address of the destination of transfer on the auxiliary memory. The movement of the data is carried out by this, the auxiliary memory 182 is accessed thereafter, and the desired data is updated. Thereafter, the notification pin changes to the ready state.

As explained above, according to the present embodiment, by combining for example a NVRAM as represented by a ferroelectric memory and a cheap and large capacity non-volatile memory as represented by a NAND type flash memory, a non-volatile memory appearing to enable random access, operating at a high speed, and having a large capacity can be realized. Further, by using an address conversion table for judgment of whether or not the desired data is present in the NVRAM, the movement of the data is enabled according to need between the two memories. It is possible to minimize the overhead accompanied with rewriting of the flash memory by this and realize high speed operation. Further, when employing the memory according to the present embodiment in a battery backed up mobile device, no power consumption is required for holding the data in the standby mode, therefore the service life of the battery can be greatly prolonged. Further, the system configuration becomes simpler. In addition, most of memory units can be replaced by a cheap NAND type flash memory, therefore the total memory cost can be reduced.

Note that, in the present embodiment, an explanation was given by taking as an example a ferroelectric memory as the NVRAM as the first memory and a NAND flash memory as the main memory constituting the second memory, but the present invention is not limited to this. For example, other than an NVRAM and other memories, a volatile memory can be used for the first memory. Further, various types of flash memories other than the NAND type can be used for the second memory. Further, other than the non-volatile memory described above, a major effect is exhibited in terms of both cost and performance by employing the present invention in a storage device using as the main memory an inexpensive semiconductor memory having the limitation of deteriorating in access performance depending upon the region.

Summarizing the effects of the embodiments of the invention, according to enmbodiments of the present present invention, it becomes unnecessary to reflect the updating of the cache memory in the main memory while obtaining equivalent effects to those of the cache memory in the past, and it becomes possible to construct a more flexible, efficient memory system. For example, a flexible semiconductor storage device able to secure a high speed transfer capability while using a flash memory having a low price and a large capacity as the main memory and able to update a very small region without waste can be realized. Further, even in a hard disk system, a high speed storage device having a small number of seek operations can be realized. In general, the effects of the present invention are remarkable in a storage device using as the main memory a memory having the limitation of causing the access performance to deteriorate depending upon the region. It is possible to greatly enhance the access performance in comparison with a conventional cache system.

Further, according to embodiments of the present invention, a non-volatile memory appearing to enable random access, operating at a high speed, and having a large capacity can be realized. Further, by using an address conversion table for judgment of whether or not the desired data is present in the NVRAM, movement of the data is enabled according to need between the two memories, and it becomes possible to minimize the overhead accompanying rewriting of the flash memory and realize a high speed operation. Further, when employing the memory according to the present invention in a battery backup type mobile device, since no power consumption is required for holding the data in the stand-by mode, the service life of the battery can be greatly prolonged. Further, the system configuration becomes simple, and in addition most of the memory unit can be replaced by a cheap NAND type flash memory, therefore the overall memory cost can be reduced.

It should be understood by those skilled in the art that various modifications, combinations, sub-combinations and alterations may occur depending on design requirements and other factors insofar as they are within the scope of the appended claims or the equivalents thereof.

What we claim is:
1. A storage device comprising:
an address conversion table configured to store physical addresses of data;
a location in main memory configured to store said data, said location in the main memory being identifiable by one of the physical addresses;

a location in auxiliary memory configured to store said data, said location in the auxiliary memory being identifiable by another of the physical addresses, wherein said auxiliary memory has an access speed higher than said main memory.

2. A storage device as set forth in claim 1, wherein said address conversion table is backed-up within said auxiliary memory.

3. A storage device as set forth in claim 1, wherein said physical addresses are stored within said address conversion table at logical addresses.

4. A storage device as set forth in claim 3, wherein said one of the physical addresses is stored within said address conversion table at one of the logical addresses.

5. A storage device as set forth in claim 4, wherein said another of the physical addresses is stored within said address conversion table at another of the logical addresses.

6. A storage device as set forth in claim 3, wherein a control circuit extracts said logical addresses from sector addresses, said logical addresses being the higher bits of said sector addresses.

7. A storage device as set forth in claim 6, wherein said address conversion table is random access memory within said control circuit.

8. A storage device as set forth in claim 6, wherein said control circuit controls movement of said data between said auxiliary memory and said main memory.

9. A storage device as set forth in claim 6, wherein said control circuit invalidates original page regions in said auxiliary memory.

10. A storage device as set forth in claim 6, wherein said control circuit invalidates original page regions in said main memory.

11. A storage device as set forth in claim 3, wherein said logic addresses are addresses for pages of said data, said pages being units of said data.

12. A storage device as set forth in claim 11, wherein said address conversion table indicates correspondences between said addresses for the pages and actual locations of said data within said auxiliary or main memory.

13. A storage device as set forth in claim 1, wherein an interface circuit acquires said data from an internal bus.

14. A storage device as set forth in claim 13, wherein said interface circuit includes a page buffer, said data being transferable to said page buffer.

15. A storage device as set forth in claim 14, wherein a storage capacity of said auxiliary memory is smaller than said main memory.

16. A storage device as set forth in claim 1, wherein said main memory is flash memory and said auxiliary memory is ferroelectric memory.

17. A storage device as set forth in claim 1, wherein said main memory is a hard disk drive and said auxiliary memory is a semiconductor memory.

18. A storage device as set forth in claim 1, wherein said main memory includes a semiconductor memory requiring previous erasing for rewriting and said auxiliary memory includes a semiconductor memory having a faster rewriting speed than said main memory.

19. A storage device as set forth in claim 1, wherein said auxiliary memory is volatile memory.

20. A storage device as set forth in claim 1, wherein said main memory includes a non-volatile memory.

21. A storage device as set forth in claim 20, wherein said auxiliary memory includes a non-volatile memory using a ferroelectric material, a phase change material, a ferromagnetic material, or a magnetoresistance effect material for the memory element.

22. A storage device as set forth in claim 1, wherein said data stored in said auxiliary memory is managed by a link list using said physical addresses as indices, newly stored data being added to one end of a link.

23. A storage device as set forth in claim 22, wherein a management table of the link list includes a spare field for each index and stores said logic addresses corresponding to each data.

* * * * *